US012635336B2

(12) United States Patent
Lee et al.

(10) Patent No.: US 12,635,336 B2
(45) Date of Patent: May 19, 2026

(54) DISPLAY APPARATUS INCLUDING FIRST AND SECOND PIXEL CIRCUITS

(71) Applicant: Samsung Display Co., Ltd., Yongin-si (KR)

(72) Inventors: Pilsuk Lee, Yongin-si (KR); Yoomin Ko, Yongin-si (KR); Sunho Kim, Yongin-si (KR); Juchan Park, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 888 days.

(21) Appl. No.: 17/902,591

(22) Filed: Sep. 2, 2022

(65) Prior Publication Data

US 2023/0247863 A1 Aug. 3, 2023

(30) Foreign Application Priority Data

Jan. 28, 2022 (KR) ........................ 10-2022-0013611

(51) Int. Cl.
*H10K 59/121* (2023.01)
*H10K 59/131* (2023.01)
(Continued)

(52) U.S. Cl.
CPC ....... *H10K 59/1213* (2023.02); *H10K 59/131* (2023.02); *H10D 86/421* (2025.01); *H10D 86/441* (2025.01); *H10D 86/60* (2025.01)

(58) Field of Classification Search
CPC ............. H10K 59/1213; H10K 59/131; H10K 50/805; H10D 86/421; H10D 86/441;
(Continued)

(56) References Cited

U.S. PATENT DOCUMENTS 8,324,618 B2 * 12/2012 Udagawa ........... H10K 59/1213
257/40
9,905,557 B2 * 2/2018 Saito .................... H10D 64/118
(Continued)

FOREIGN PATENT DOCUMENTS

JP 2021-101468 7/2021
KR 10-2006-0084216 A 7/2006
(Continued)

*Primary Examiner* — Tan N Tran
(74) *Attorney, Agent, or Firm* — Harness, Dickey & Pierce, P.L.C.

(57) ABSTRACT

A display apparatus includes a substrate including a first display region and a second display region of a display region; a first pixel circuit disposed in the first display region and including a first semiconductor layer including a first channel region, a first gate electrode, and a first electrode; and a second pixel circuit disposed in the second display region and including a second semiconductor layer including a second channel region, a ratio of a first overlapping area of a first overlapping region of the first channel region overlapping the first electrode in a plan view to a first channel region of the first channel region is less than a ratio of a second overlapping area of a second overlapping region of the second channel region overlapping the second electrode to a second channel region of the second channel region in the plan view.

20 Claims, 24 Drawing Sheets

(51) Int. Cl.
    *H10D 86/40*          (2025.01)
    *H10D 86/60*          (2025.01)

(58) Field of Classification Search
    CPC .... H10D 86/60; H10D 86/423; H10D 86/481;
               H10D 30/6755; G09G 3/3233; G09G
                        2300/0426; G09G 3/3266
    See application file for complete search history.

(56)                 References Cited

U.S. PATENT DOCUMENTS

| | | | |
|---|---|---|---|
| 10,290,745 | B2 | 5/2019 | Yamazaki et al. |
| 10,326,026 | B2 | 6/2019 | Yamazaki |
| 11,107,416 | B2 | 8/2021 | Cho et al. |
| 11,791,345 | B2 * | 10/2023 | Takahata ........... H01L 21/02565 |
| | | | 257/43 |
| 11,968,862 | B2 * | 4/2024 | Diao .................. H10D 30/6723 |
| 12,284,872 | B2 * | 4/2025 | Yuan .................. H10K 59/1213 |
| 2021/0202633 | A1 | 7/2021 | Song et al. |

FOREIGN PATENT DOCUMENTS

| | | |
|---|---|---|
| KR | 10-2109601 | 5/2020 |
| KR | 10-2020-0129222 A | 11/2020 |
| KR | 10-2021-0084733 | 7/2021 |

* cited by examiner

FIG. 16

DISPLAY APPARATUS INCLUDING FIRST AND SECOND PIXEL CIRCUITS

CROSS-REFERENCE TO RELATED APPLICATION(S)

This application claims priority to and benefits of Korean Patent Application No. 10-2022-0013611 under 35 U.S.C. § 119, filed on Jan. 28, 2022, in the Korean Intellectual Property Office, the entire contents of which are incorporated herein by reference.

BACKGROUND

1. Technical Field

One or more embodiments relate to display apparatuses.

2. Description of the Related Art

A display apparatus visually displays data. The display apparatus is used as a display of a small-sized product, such as a mobile phone, and as a display of a large-sized product, such as a television.

The display apparatus may include pixels that receive an electrical signal to emit light, to display an image to the outside. Each of the pixels may include a display element. For example, an organic light-emitting display apparatus may include an organic light-emitting diode (OLED) as a display element. In general, in the organic light-emitting display apparatus, a thin-film transistor and an OLED are provided on a substrate, and the OLED emits light by itself.

As the use of display apparatuses has recently diversified, various designs for improving the quality of display apparatuses have been made.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus with an extended display region.

The disclosure is not limited to that described above, and other technical objectives will be clearly understood by those skilled in the art from the written description of the disclosure.

Additional aspects will be set forth in part in the description that follows and, in part, will be apparent from the description, or may be learned by practice of the presented embodiments of the disclosure.

According to an embodiment, a display apparatus may include a substrate including a first display region and a second display region of a display region; a first pixel circuit disposed in the first display region and including a first semiconductor layer; a first gate electrode; and a first electrode, wherein the first semiconductor layer may include a first channel region, the first gate electrode overlaps the first channel region in a plan view, and the first electrode is disposed on the first gate electrode and electrically connected to the first gate electrode; and a second pixel circuit disposed in the second display region and including a second semiconductor layer; a second gate electrode; and a second electrode, wherein the second semiconductor layer may include a second channel region, the second gate electrode overlaps the second channel region in the plan view, and the second electrode is disposed on the second gate electrode and electrically connected to the second gate electrode, wherein a ratio of a first overlapping area of a first overlapping region of the first channel region overlapping the first electrode to a first channel region of the first channel region in the plan view is less than a ratio of a second overlapping area of a second overlapping region of the second channel region overlapping the second electrode to a second channel region of the second channel region in the plan view.

The display apparatus may further include a first display element disposed on the first display region and electrically connected to the first pixel circuit; and second display elements disposed on the second display region and electrically connected to the second pixel circuit.

The first pixel circuit may include a first driving transistor having a portion of the first semiconductor layer and the first gate electrode and that outputs a first driving current to the first display element, and the second pixel circuit may include a second driving transistor having a portion of the second semiconductor layer and the second gate electrode and outputs a second driving current to the second display elements.

A magnitude of the first driving current of the first display element that emits light with a first grayscale may be less than a magnitude of the second driving current of the second display elements that emit light with the first grayscale.

The second driving current may be substantially equally distributed to the second display elements, and a magnitude of a current flowing in each of the second display elements may be substantially equal to a magnitude of the first driving current.

An emission area of each of the second display elements may be substantially equal to an emission area of the first display element.

The display apparatus may further include a gate driving circuit disposed in the second display region and transmits a gate signal to the first pixel circuit and the second pixel circuit, and the second display elements at least partially overlap the gate driving circuit in the plan view.

At least a portion of the first electrode may overlap the first channel region in the plan view.

A ratio of a width of the second channel region to a length of the second channel region may be greater than a ratio of a width of the first channel region to a length of the first channel region.

A ratio of a width of the second channel region to a length of the second channel region may be substantially equal to a ratio of a width of the first channel region to a length of the first channel region.

A mobility of the second channel region may be greater than a mobility of the first channel region.

An amount of hydrogen included in the second channel region may be greater than an amount of hydrogen included in the first channel region.

Each of the first electrode and the second electrode may have a first layer and a second layer, the second layer being disposed on the first layer.

The first pixel circuit may include a third semiconductor layer; and a first connection electrode, the third semiconductor layer and the first semiconductor layer may include a different material, and the first connection electrode electrically connecting the first electrode to the third semiconductor layer, and the second pixel circuit may include a fourth semiconductor layer; and a second connection electrode, the fourth semiconductor layer and the second semiconductor layer including a different material, and the second connection electrode electrically connecting the second electrode to the fourth semiconductor layer.

Each of the first semiconductor layer and the second semiconductor layer may include a silicon semiconductor material, and each of the third semiconductor layer and the fourth semiconductor layer may include an oxide semiconductor material.

The display apparatus may further include a data line disposed in the display region and extending in a first direction; a data pad unit disposed outside of the display region; and a connection line that transmits a data signal received from the data pad unit to the data line, and having a first portion and a second portion, the first portion extending in the first direction, and the second portion extending in a second direction and electrically connecting the first portion to the data line, wherein the second portion of the connection line, the first connection electrode and the second connection electrode are disposed on a same layer as a layer.

The first pixel circuit may include a third electrode; a first conductive pattern, and a first contact hole, and the third electrode may be disposed between the first gate electrode and the first electrode, the first conductive pattern may be disposed on the first electrode and receives a driving voltage, and the first contact hole connects the third electrode to the first conductive pattern, the second pixel circuit may include a fourth electrode, a second conductive pattern, and a second contact hole, wherein the fourth electrode may be disposed between the second gate electrode and the second electrode, the second conductive pattern may be disposed on the second electrode and receives the driving voltage, and the second contact hole connects the fourth electrode to the second conductive pattern, and a first distance between the first contact hole and the first channel region may be less than a second distance between the second contact hole and the second channel region.

A peripheral region outside of the display region may be included in the substrate, and the second display region may be disposed between the first display region and the peripheral region.

According to an embodiment, a display apparatus may include a first pixel circuit including a first semiconductor layer; a first gate electrode; and a first electrode, wherein the first semiconductor layer may include a first channel region, the first gate electrode overlaps the first channel region in a plan view, and the first electrode may be disposed on the first gate electrode and electrically connected to the first gate electrode; a second pixel circuit including a second semiconductor layer; a second gate electrode; and a second electrode, wherein the second semiconductor layer may include a second channel region, the second gate electrode overlaps the second channel region in the plan view, and the second electrode may be disposed on the second gate electrode and electrically connected to the second gate electrode; a first display element electrically connected to the first pixel circuit, and second display elements electrically connected to the second pixel circuit, wherein a ratio of a first overlapping area of a first overlapping region of the first channel region overlapping the first electrode to a first channel area of the first channel region in the plan view may be less than a ratio of a second overlapping area of a second overlapping region of the second channel region overlapping the second electrode to a second channel area of the second channel region in the plan view.

4

The first pixel circuit may include a first driving transistor having a portion of the first semiconductor layer and the first gate electrode that outputs a first driving current to the first display element, the second pixel circuit may include a second driving transistor having a portion of the second semiconductor layer and the second gate electrode that outputs a second driving current to the second display elements, and a number of the second display elements may be n, and a magnitude of the second driving current may be about n times a magnitude of the first driving current.

A ratio of a width of the second channel region to a length of the second channel region may be greater than a ratio of a width of the first channel region to a length of the first channel region.

An amount of hydrogen included in the second channel region may be greater than an amount of hydrogen included in the first channel region.

Each of the first electrode and the second electrode may have a first layer and a second layer, the second layer being disposed on the first layer.

The first pixel circuit may include a third semiconductor layer; and a first connection electrode, the third semiconductor layer including an oxide semiconductor material, and the first connection electrode electrically connecting the first electrode to the third semiconductor layer, and the second pixel circuit may include a fourth semiconductor layer and a second connection electrode, the fourth semiconductor layer including an oxide semiconductor material, and the second connection electrode electrically connecting the second electrode to the fourth semiconductor layer.

The first pixel circuit may include a third electrode; a first conductive pattern; and a first contact hole, wherein the third electrode may be disposed between the first gate electrode and the first electrode, the first conductive pattern may be disposed on the first electrode and receives a driving voltage, and the first contact hole connects the third electrode to the first conductive pattern, the second pixel circuit may further include a fourth electrode; a second conductive pattern, and a second contact hole, wherein the fourth electrode may be disposed between the second gate electrode and the second electrode, the second conductive pattern may be disposed on the second electrode and receives the driving voltage, and the second contact hole connects the fourth electrode to the second conductive pattern, and a first distance between the first contact hole and the first channel region may be less than a second distance between the second contact hole and the second channel region.

These and/or other aspects will become apparent and more readily appreciated from the following description of the embodiments, the claims, and the accompanying drawings.

These general and other aspects may be carried out by using a system, a method, a computer program, or any combinations thereof.

BRIEF DESCRIPTION OF THE DRAWINGS

The above and other aspects, features, and advantages of embodiments will be more apparent from the following description taken in conjunction with the accompanying drawings, in which:

FIG. 16 is a schematic cross-sectional view of a portion of FIG. 15A, taken along line in FIG. 15A, as an example;

DETAILED DESCRIPTION OF THE EMBODIMENTS

Figure 1:
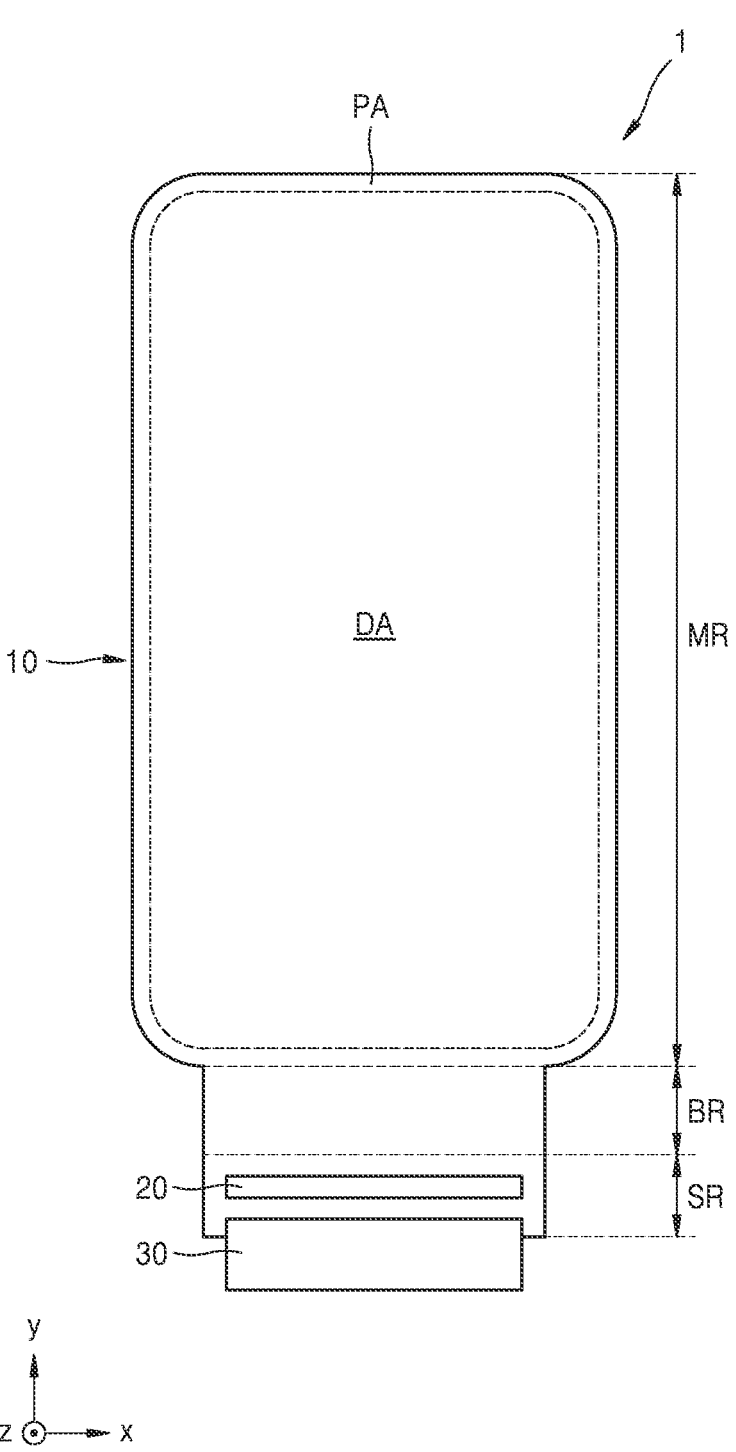
FIG. 1 is a schematic schematically illustrating a display apparatus according to an embodiment.

Reference will now be made in detail to embodiments, examples of which are illustrated in the accompanying drawings, wherein like reference numerals refer to like elements throughout the disclosure. In this regard, the embodiments may have different forms and should not be construed as being limited to the descriptions set forth herein. Accordingly, the embodiments are described below, by referring to the figures, to explain aspects of the disclosure.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Throughout the disclosure, the expression "at least one of a, b, or c" indicates only a, only b, only c, both a and b, both a and c, both b and c, all of a, b, and c, or any variations thereof.

As the disclosure allows for various changes and numerous embodiments, embodiments will be illustrated in the drawings and described in detail in the written description of the disclosure. Hereinafter, effects and features of the disclosure and a method for accomplishing them will be described more fully with reference to the accompanying drawings, in which embodiments of the disclosure are shown. The disclosure may, however, be embodied in many different forms and should not be construed as limited to the embodiments set forth herein.

Hereinafter, embodiments will be described with reference to the accompanying drawings, wherein like reference numerals refer to like elements throughout the disclosure and a repeated description thereof is omitted.

It will be understood that although the terms "first," "second," etc. may be used herein to describe various elements, these components should not be limited by these terms. These elements are only used to distinguish one element from another element. For example, a first element may be referred to as a second element, and similarly, a second element may be referred to as a first element without departing from the scope of the disclosure.

In the embodiments below, the singular forms include the plural forms unless the context clearly indicates otherwise. For example, as used herein, the singular forms, "a," "an," and "the" are intended to include the plural forms as well, unless the context clearly indicates otherwise.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when a layer, region, or element is referred to as being "formed on" another layer, region, or element, it can be directly or indirectly formed on the other layer, region, or element. For example, intervening layers, regions, or elements may be present.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Sizes of elements in the drawings may be exaggerated or reduced for convenience of explanation. For example, because sizes and thicknesses of elements in the drawings are arbitrarily illustrated for convenience of explanation, the disclosure is not limited thereto.

When an embodiment may be implemented differently, a process order may be performed differently from the described order. For example, two consecutively described processes may be performed substantially at the same time or performed in an order opposite to the described order.

It will be understood that when a layer, region, or element is referred to as being "connected" to another layer, region, or element, it may be "directly connected" to the other layer, region, or element and/or may be "indirectly connected" to the other layer, region, or element with other layer, region, or element located therebetween. For example, it will be understood that when a layer, region, or element is referred to as being "electrically connected" to another layer, region, or element, it may be "directly electrically connected" to the other layer, region, or element and/or may be "indirectly electrically connected" to other layer, region, or element with other layer, region, or element located therebetween.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
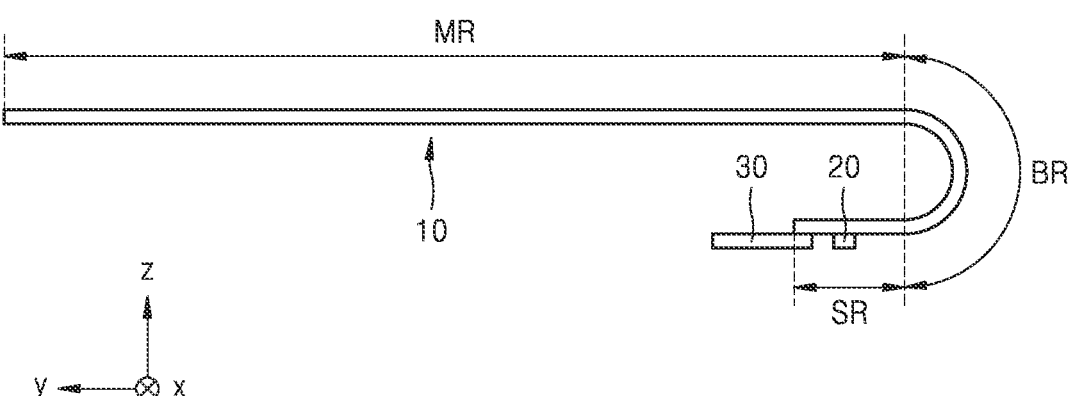
FIG. 2 is a side view schematically illustrating a display apparatus according to an embodiment.

FIG. 1 is a schematic plan view schematically illustrating a display apparatus 1 according to an embodiment, and FIG. 2 is a side view schematically illustrating a display apparatus 1 according to an embodiment. In FIG. 2, part of the display apparatus 1 according to an embodiment is bent. However, in FIG. 1, the display apparatus 1 is shown as not being bent, for convenience.

Referring to FIGS. 1 and 2, the display apparatus 1 may include a display panel 10. The display apparatus 1 may be any display apparatus that may include the display panel 10. For example, the display apparatus 1 may include various products, such as smartphones, tablet personal computers (PC), televisions, or advertisement boards.

The display panel 10 may include a display region DA and a peripheral region PA, which is outside (or on an outer periphery of) the display region DA. However, because the display panel 10 may include a substrate 100 (see FIG. 3), it may be understood that the substrate 100 may include the display region DA and the peripheral region PA. In an embodiment, it may be understood that the display region DA and the peripheral region PA are defined in the substrate 100.

The display region DA is a region in which an image is displayed, and pixels may be arranged therein. For example, the display region DA may have various shapes, such as a circle, an ellipse, a polygon, and another figure. In FIG. 1, it is shown as an example that the display region DA has an approximately rectangular shape with round edges. It is to be understood that the shapes disclosed herein may include shapes substantial to those shapes disclosed herein.

The peripheral region PA may be arranged outside the display region DA. The peripheral region PA may be arranged to surround at least part of the display region DA.

The display panel 10 may include a main region MR, a bending region BR, and a sub-region SR, the bending region BR being outside the main region MR, and the sub-region SR being at an opposite side of the main region MR with respect to the bending region BR. Because the display panel 10 is bent in the bending region BR, as shown in FIG. 2, at least part of the sub-region SR may overlap the main region MR, in case that viewed from a z-axis direction. However, the disclosure is not limited to display apparatuses that are bendable, and also applicable to display apparatuses that are not bendable. The sub-region SR may include a non-display region, as described later. In case that the display panel 10 is bent in the bending region BR, the non-display region may not be visible in case that the display apparatus 1 is viewed from the front side thereof (in the −z direction), or even in case that the non-display region is visible, the visible area may be minimized.

A data pad unit 20 may be arranged in the sub-region SR of the display panel 10. The data pad unit 20 may include an integrated circuit (for example, a driving chip) that drives the display panel 10. The integrated circuit may be a data driving integrated circuit that generates a data signal, but the disclosure is not limited thereto.

The data pad unit 20 may be mounted on the sub-region SR of the display panel 10. The data pad unit 20 is mounted on a same surface as a display surface of the display region DA, but in case that the display panel 10 is bent in the bending region BR, as described above, the data pad unit 20 may be located on a rear surface of the main region MR. The data pad unit 20 may include pads.

A printed circuit board 30 or the like may be attached to an end of the sub-region SR of the display panel 10. The printed circuit board 30 or the like may be electrically connected to the data pad unit 20 or the like through the pads.

Hereinafter, an organic light-emitting display apparatus is described as an example of the display apparatus 1 according to an embodiment, but the display apparatus of the disclosure is not limited thereto. In an embodiment, the display apparatus 1 of the disclosure may include, for example, an inorganic light-emitting display apparatus (an inorganic light-emitting display or an inorganic electroluminescent (EL) display apparatus) or a quantum dot light-emitting display. For example, an emission layer of a display element of the display apparatus 1 may include an organic material, an inorganic material, quantum dots, an organic material and quantum dots, or an inorganic material and quantum dots.

Figure 3:
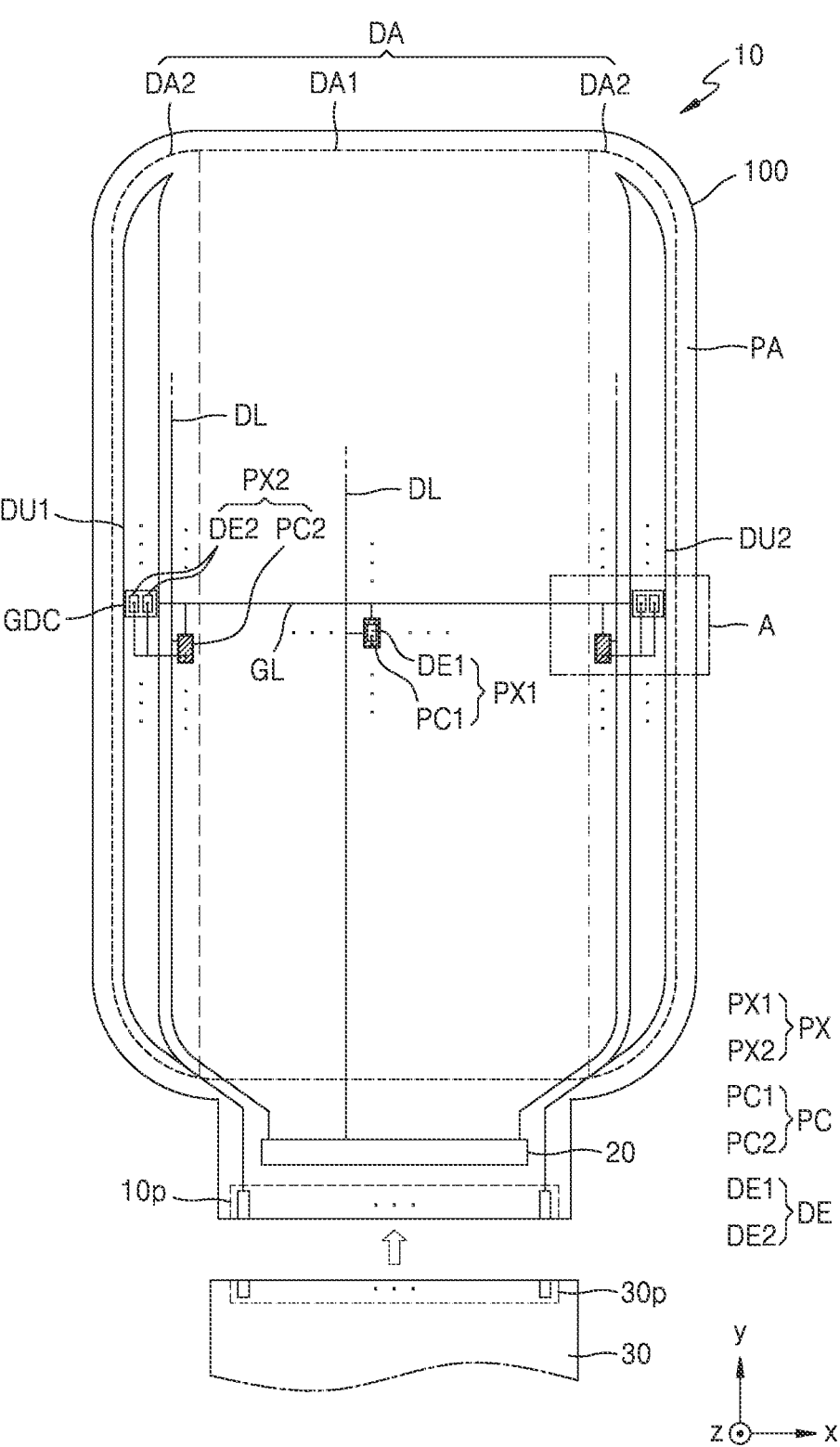
FIG. 3 is a schematic plan view schematically illustrating a display panel according to an embodiment.

FIG. 3 is a schematic plan view schematically illustrating a display panel 10 according to an embodiment.

Referring to FIG. 3, the display panel 10 may include the substrate 100. Various elements included in the display panel 10 may be disposed on the substrate 100. The substrate 100 may include glass, metal, or polymer resin. In case that the display panel 10 is bent in the bending region BR (see FIG. 1), as described above, it is necessary that the substrate 100 is flexible or bendable. The substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. However, various modifications may be made. For example, the substrate 100 may have a multi-layer structure including two layers and a barrier layer, the two layers each including the polymer resin described above, and the barrier layer being between the two layers and including an inorganic material (for example, silicon oxide, silicon nitride, silicon oxynitride, within the spirit and the scope of the disclosure).

The display region DA may include a first display region DA1 and a second display region DA2. The second display region DA2 may be located between the first display region DA1 and the peripheral region PA.

In FIG. 3, the second display regions DA2 are respectively arranged at opposite sides of the first display region DA1 in a first direction (for example, ±x direction). However, in an embodiment, one of the second display regions DA2 may be omitted. The second display region DA2 may be located at one side or a side of the first display region DA1.

Pixels PX may be arranged in the display region DA. Each of the pixels PX denotes a sub-pixel and may include a pixel circuit PC and a display element DE electrically connected to the pixel circuit PC. The pixel PX may emit red, green, or blue light.

In an embodiment, some or a number of the pixels PX may include one pixel circuit PC and one display element DE, and the other ones may include one pixel circuit PC and display elements DE.

For example, each of first pixels PX1 arranged in the first display region DA1, as shown in FIG. 3, may include a first pixel circuit PC1 and a first display element DE1 electrically connected to the first pixel circuit PC1. Each of second pixels PX2 arranged in the second display region DA2 may include a second pixel circuit PC2 and second display elements DE2 electrically connected to the second pixel circuit PC2.

In FIG. 3, two second display elements DE2 are electrically connected to one second pixel circuit PC2. However, in an embodiment, three or more second display elements DE2 may be electrically connected to one second pixel circuit PC2. For example, four second display elements DE2 may be electrically connected to one second pixel circuit PC2.

Each of the pixels PX may be electrically connected to driving circuits arranged in the second display region DA2 and/or the peripheral region PA. A first driving unit DU1 and a second driving unit DU2 may be arranged in the second display region DA2, and a terminal 10$p$ may be arranged in the peripheral region PA. Although not shown in FIG. 3, power supply lines may also be arranged in the second display region DA2 and/or the peripheral region PA.

The first driving unit DU1 may include gate driving circuits GDC. The gate driving circuits GDC may be arranged apart from each other. The gate driving circuits GDC may be connected to gate lines GL each extending in the first direction (for example, the ±x direction) and may sequentially transmit an electrical signal (or a gate signal) to pixels PX arranged in a same row as each other via the gate lines GL.

In FIG. 3, the gate line GL may include one line. However, the gate line GL may include lines. The gate line GL may include an emission control line, a scan line, and the like within the spirit and the scope of the disclosure. An emission control signal, a scan signal, and the like may be sequentially transmitted to the pixels PX arranged in a same row as each other via the gate line GL.

The second driving unit DU2 may be arranged in parallel with the first driving unit DU1 with the first display region DA1 therebetween. The second driving unit DU2 may also include gate driving circuits GDC, identical to the first driving unit DU1. The gate driving circuits GDC may be connected to gate lines GL each extending in the first direction (for example, ±x direction) and may sequentially transmit an electrical signal to pixels PX arranged in a same row as each other via the gate lines GL.

In FIG. 3, one side or a side and the other side or another side of the gate line GL are respectively connected to the gate driving circuit GDC of the first driving unit DU1 and the gate driving circuit GDC of the second driving unit DU2. However, the gate line GL may be connected to one of the gate driving circuit GDC of the first driving unit DU1 and the gate driving circuit GDC of the second driving unit DU2. For example, odd-numbered gate lines GL from among the gate lines GL may be connected to the gate driving circuit GDC of the first driving unit DU1, and even-numbered gate lines GL from among the gate lines GL may be connected to the gate driving circuit GDC of the second driving unit DU2. In another example, the second driving unit DU2 may be omitted.

In an embodiment, a second pixel PX2 arranged in the second display region DA2 may at least partially overlap the gate driving circuit GDC. The second display elements DE2 of the second pixel PX2 may at least partially overlap the gate driving circuit GDC. Because the second display elements DE2 are disposed on the gate driving circuit GDC, the display region DA of the display panel 10 may extend from the first display region DA1 to the second display region DA2.

The terminal 10$p$ arranged in the peripheral region PA may be exposed without being covered with an insulating layer, and electrically connected to the printed circuit board 30. A terminal 30$p$ of the printed circuit board 30 may be electrically connected to the terminal 10$p$ of the display panel 10.

The printed circuit board 30 may transmit a signal or power from a controller (not shown) to the display panel 10. A control signal generated by the controller may be transmitted to the first driving unit DU1 and the second driving unit DU2 via the printed circuit board 30. Although not shown in FIG. 3, the controller may apply driving voltages to the power supply lines, respectively.

The controller may generate a data signal, and the generated data signal may be transmitted to a data line DL via the data pad unit 20. The data signal may be sequentially transmitted to pixels PX arranged in a same column via the data lines DL each extending in a second direction (for example, a ±y direction).

Figure 4:
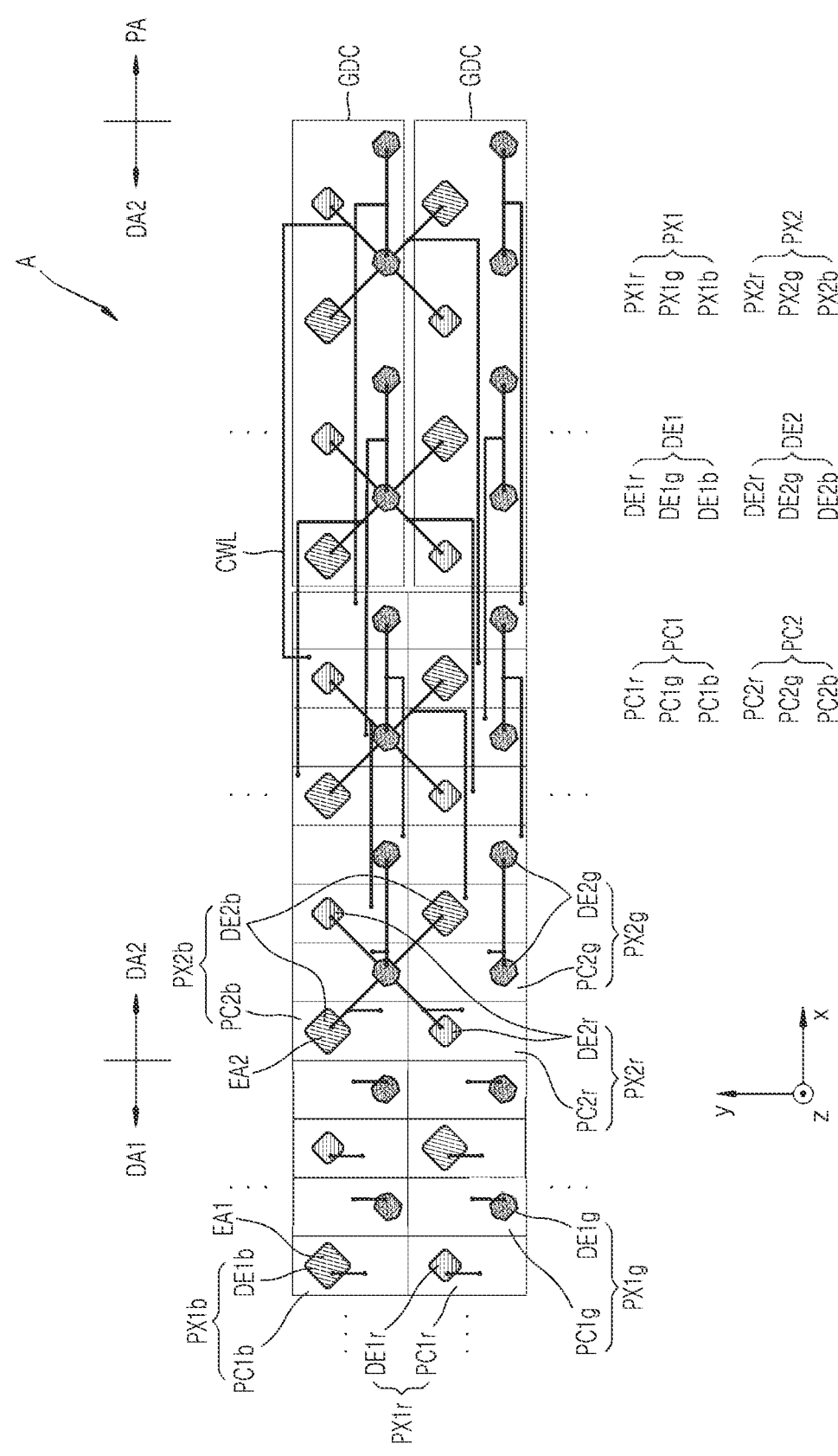
FIG. 4 is an enlarged schematic plan view illustrating region A in FIG. 3 as an example.

FIG. 4 is an enlarged schematic plan view illustrating region A in FIG. 3 as an example.

Referring to FIG. 4, first pixels PX1 may be arranged in the first display region DA1, and second pixels PX2 may be arranged in the second display region DA2.

The first pixel PX1 may include a first pixel circuit PC1 and a first display element DE1 electrically connected to the first pixel circuit PC1.

For example, first pixels PX1 emitting red light from among the first pixels PX1 may be referred to as first red pixels PX1$r$, first pixels PX1 emitting green light from among the first pixels PX1 may be referred to first green pixels PX1$g$, and first pixels PX1 emitting blue light from among the first pixels PX1 may be referred to as first blue pixels PX1$b$. The first red pixel PX1$r$ may include a $1^{st}$-$1^{st}$ pixel circuit PC1$r$ and a first red display element DE1$r$ electrically connected to the $1^{st}$-$1^{st}$ pixel circuit PC1$r$, the first green pixel PX1$g$ may include a $1^{st}$-$2^{nd}$ pixel circuit PC1$g$ and a first green display element DE1$g$ electrically connected to the $1^{st}$-$2^{nd}$ pixel circuit PC1$g$, and the first blue pixel PX1$b$ may include a $1^{st}$-$3^{rd}$ pixel circuit PC1$b$ and a first blue display element DE1$b$ electrically connected to the $1^{st}$-$3^{rd}$ pixel circuit PC1$b$.

In an embodiment, the first pixels PX1 may be arranged in a PENTILE™ structure. In other words, the first display elements DE1 may be arranged in a PENTILE™ structure. For example, the first red display element DE1$r$ may be arranged at first and third vertices from among vertices of a virtual quadrangle having a center point of the first green display element DE1g as the center point thereof, and the first blue display element DE1b may be arranged at the remaining second and fourth vertices. An emission area of the first green display element DE1g may be less than each of an emission area of the first red display element DE1r and an emission area of the first blue display element DE1b. This pixel arrangement structure may be referred to as a PEN-TILE™ matrix structure, or a PENTILE structure, and in case that a rendering operation for expressing a color by sharing adjacent pixels is applied, a high-resolution image may be implemented with a small number of pixels.

In FIG. 4, the first pixels PX1 are arranged in a PEN-TILE™ matrix structure. However, in an embodiment, the first pixels PX1 may be arranged in various shapes, such as a stripe structure, a mosaic arrangement structure, and a delta arrangement structure.

In an embodiment, the first pixel circuit PC1 and the first display element DE1 may overlap each other. For example, the $1^{st}$-$1^{st}$ pixel circuit PC1r and the first red display element DE1r may overlap each other, the $1^{st}$-$2^{nd}$ pixel circuit PC1g and the first green display element DE1g may overlap each other, and the $1^{st}$-$3^{rd}$ pixel circuit PC1b and the first blue display element DE1b may overlap each other.

The second pixel PX2 may include the second pixel circuit PC2 and second display elements DE2 connected to the second pixel circuit PC2. The second pixel circuit PC2 and the second display elements DE2 may be connected to each other by a connection line CWL.

For example, second pixels PX2 emitting red light from among the second pixels PX2 may be referred to as second red pixels PX2r, second pixels PX2 emitting green light from among the second pixels PX2 may be referred to as second green pixels PX2g, and second pixels PX2 emitting blue light from among the second pixels PX2 may be referred to as second blue pixels PX2b. The second red pixel PX2r may include a $2^{nd}$-$1^{st}$ pixel circuit PC2r and second red display elements DE2r electrically connected to the $2^{nd}$-$1^{st}$ pixel circuit PC2r, the second green pixel PX2g may include a $2^{nd}$-$2^{nd}$ pixel circuit PC2g and second green display elements DE2g electrically connected to the $2^{nd}$-$2^{nd}$ pixel circuit PC2g, and the second blue pixel PX2b may include a $2^{nd}$-$3^{rd}$ pixel circuit PC2b and second blue display elements DE2b electrically connected to the $2^{nd}$-$3^{rd}$ pixel circuit PC2b.

In FIG. 4, two second display elements DE2 are electrically connected to one second pixel circuit PC2. However, in an embodiment, three or more second display elements DE2 may be electrically connected to one second pixel circuit PC2. For example, four second display elements DE2 may be electrically connected to one second pixel circuit PC2.

In an embodiment, the second pixels PX2 may be arranged in a PENTILE™ structure. In other words, the second display elements DE2 may be arranged in a PEN-TILE™ structure. For example, the second red display element DE2r may be arranged at first and third vertices from among vertices of a virtual quadrangle having a center point of the second green display elements DE2g as the center point thereof, and the second blue display elements DE2b may be arranged at the remaining second and fourth vertices. An emission area of the second green display elements DE2g may be less than each of an emission area of the second red display elements DE2r and an emission area of the second blue display elements DE2b.

In FIG. 4, the second pixels PX2 are arranged in a PENTILE™ matrix structure. However, in an embodiment, the second pixels PX2 may be arranged in various shapes, such as a stripe structure, a mosaic arrangement structure, and a delta arrangement structure.

In an embodiment, the second display elements DE2 may overlap at least a portion of the second pixel circuit PC2 and/or at least a portion of the gate driving circuit GDC. For example, some or a number of the connection lines CWL connecting the second pixel circuit PC2 and the second display elements DE2 to each other may each extend in the first direction (for example, the ±x direction), and some or a number of the second display elements DE2 may be disposed on the gate driving circuit GDC. Some or a number of the second display elements DE2 may overlap the gate driving circuit GDC without overlapping the second pixel circuit PC2. Other second display elements DE2 may overlap the second pixel circuit PC2 without overlapping the gate driving circuit GDC. The other second display elements DE2 may overlap a portion of the second pixel circuit PC2 and a portion of the gate driving circuit GDC.

In an embodiment, an emission area EA2 of each of the second display elements DE2 may be substantially equal to an emission area EA1 of each of the first display elements DE1. For example, an emission area of the second red display element DE2r may be substantially equal to the emission area of the first red display element DE1r, an emission area of the second green display element DE2g may be equal to the emission area of the first green display element DE1g, and an emission area of the second blue display element DE2b may be substantially equal to the emission area of the first blue display element DE1b.

In FIG. 4, the emission area EA2 of the second display element DE2 and the emission area EA1 of the first display element DE1 are substantially equal to each other. However, in an embodiment, the emission area EA2 of the second display element DE2 and the emission area EA1 of the first display element DE1 may be different from each other.

In FIG. 4, each of the first display element DE1 and the second display element DE2 has an octagonal shape. However, in an embodiment, the first display element DE1 and the second display element DE2 may have various shapes, such as a circle, an ellipse, a polygon, such as a quadrangle, or a diamond. Here, the shape of the first display element DE1 and the shape of the second display element DE2 may refer to a shape of an emission region in which the first display element DE1 and the second display element DE2 emit light.

In an embodiment, the first pixel circuit PC1 may output a first driving current to the first display element DE1, and the second pixel circuit PC2 may output a second driving current to the second display elements DE2. The second driving current may be substantially equally distributed to the second display elements DE2, and a magnitude of a current flowing in each of the second display elements DE2 may be substantially equal to a magnitude of the first driving current. The first display element DE1 and the second display element DE2 emit light with substantially the same luminance as each other, and thus, the luminance of the first display region DA1 and the luminance of the second display region DA2 are substantially the same as each other. Therefore, a boundary between the first display region DA1 and the second display region DA2 may be prevented from being visible.

Figure 5:
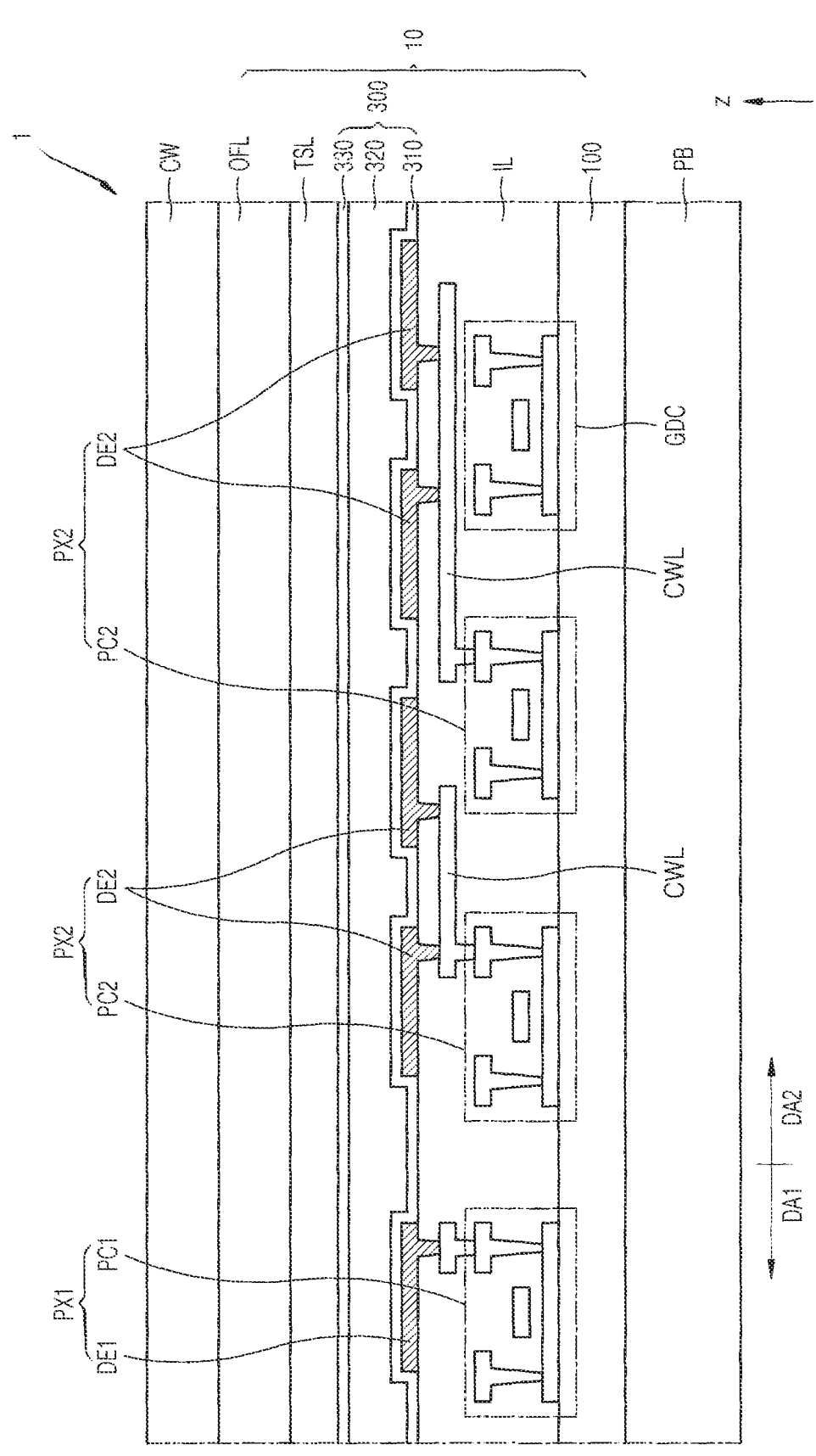
FIG. 5 is a schematic cross-sectional view schematically illustrating a display apparatus according to an embodiment.

FIG. 5 is a schematic cross-sectional view schematically illustrating a display apparatus 1 according to an embodiment.

Referring to FIG. 5, the display apparatus 1 may include a display panel 10, a panel protection member PB, and a cover window CW. The display panel 10 may include a substrate 100, an insulating layer IL, a first pixel PX1, a second pixel PX2, a gate driving circuit GDC, an encapsulation layer 300, a touch sensor layer TSL, and an optical functional layer OFL. As described above with reference to FIG. 4, the first pixel PX1 is arranged in the first display region DA1 and may include a first pixel circuit PC1 and a first display element DE1. The second pixel PX2 is arranged in the second display region DA2 and may include a second pixel circuit PC2 and second display elements DE2.

The substrate 100 may include an insulating material, such as glass, quartz, and a polymer resin. The substrate 100 may include a rigid substrate or a flexible substrate that is bendable, foldable, or rollable.

The insulating layer IL, the first pixel circuit PC1, the second pixel circuit PC2, and the gate driving circuit GDC may be disposed on the substrate 100. The insulating layer IL may insulate elements of the display panel 10. The insulating layer IL may include at least one of an organic material and an inorganic material. The first pixel circuit PC1 may be electrically connected to the first display element DE1 and drive the first display element DE1. The first pixel circuit PC1 may be inserted into the insulating layer IL. The second pixel circuit PC2 may be electrically connected to the second display elements DE2 and drive the second display elements DE2. The second pixel circuit PC2 may be inserted into the insulating layer IL. The gate driving circuit GDC may transmit a gate signal to the first pixel circuit PC1 and the second pixel circuit PC2, which are arranged in a same row as a row in which the gate driving circuit GDC is arranged. The gate driving circuit GDC may be inserted into the insulating layer IL.

The first display element DE1 and the second display element DE2 may be disposed on the insulating layer IL. In an embodiment, the first display element DE1 and the second display element DE2 may be OLEDs each including an organic emission layer. In an embodiment, the first display element DE1 and the second display element DE2 may be light-emitting diodes (LED). A size of the LED may be in a microscale or a nanoscale. For example, the LED may be a micro LED. In an embodiment, the LED may be a nanorod LED. The nanorod LED may include a gallium nitride (GaN). In an embodiment, a color-conversion layer may be disposed on the nanorod LED. The color-conversion layer may include quantum dots. In an embodiment, the first display element DE1 and the second display element DE2 may be quantum dot LEDs each including a quantum dot emission layer. In an embodiment, the first display element DE1 and the second display element DE2 may be inorganic LEDs each including an inorganic semiconductor.

In an embodiment, one second pixel circuit PC2 and the second display elements DE2 may be electrically connected to each other by the connection line CWL. The connection line CWL may include a transparent conductive material. For example, the connection line CWL may include a transparent conducting oxide (TCO). The connection line CWL may include a conducting oxide, such as indium tin oxide (ITO), indium zinc oxide (IZO), zinc oxide (ZnO), indium oxide ($In_2O_3$), indium gallium oxide (IGO), or aluminum zinc oxide (AZO).

In an embodiment, the second display elements DE2 may overlap at least a portion of the second pixel circuit PC2 and/or at least a portion of the gate driving circuit GDC. For example, some or a number of the connection lines CWL connecting the second pixel circuit PC2 and the second display elements DE2 to each other may extend in the first direction (for example, the ±x direction), and some or a number of the second display elements DE2 may be disposed on the gate driving circuit GDC. Some or a number of the second display elements DE2 may overlap the gate driving circuit GDC without overlapping the second pixel circuit PC2.

The encapsulation layer 300 may cover the first display element DE1 and the second display elements DE2. In an embodiment, the encapsulation layer 300 may include at least one inorganic encapsulation layer and at least one organic encapsulation layer. The at least one inorganic encapsulation layer may include one or more inorganic materials from among $Al_2O_3$, titanium oxide ($TiO_2$), tantalum oxide ($Ta_2O_5$), ZnO, silicon oxide ($SiO_2$), silicon nitride ($SiN_x$), and silicon oxynitride (SiON). The at least one organic encapsulation layer may include a polymer-based material. The polymer-based material may include an acryl-based resin, an epoxy-based resin, polyimide, polyethylene, and the like within the spirit and the scope of the disclosure. In an embodiment, the at least one organic encapsulation layer may include acrylate.

In an embodiment, the encapsulation layer 300 may include a first inorganic encapsulation layer 310, an organic encapsulation layer 320, and a second inorganic encapsulation layer 330, which may be sequentially stacked each other. The first inorganic encapsulation layer 310 and the second inorganic encapsulation layer 330 may prevent or reduce exposure of the organic encapsulation layer 320 and/or the first display element DE1 and second display elements DE2 to foreign substances, such as moisture.

In an embodiment, the encapsulation layer 300 may have a structure in which the substrate 100 and an upper substrate, which is a transparent member, are connected or coupled to each other by a sealing member so that an internal space between the substrate 100 and the upper substrate is sealed. A moisture absorbent, a filler, or the like may be located in the internal space. The sealing member may include a sealant, and in an embodiment, may include a material cured by laser. For example, the sealing member may include frit. For example, the sealing member may include a urethane-based resin, an epoxy-based resin, an acryl-based resin, which are organic sealants, or silicone, which is an inorganic sealant. For example, the urethane-based resin may include urethane acrylate, within the spirit and the scope of the disclosure. For example, the acryl-based resin may include butyl acrylate, ethylhexyl acrylate, within the spirit and the scope of the disclosure. The sealing member may include a material cured by heat.

The touch sensor layer TSL may obtain coordinate information according to an external input, for example, a touch event. The touch sensor layer TSL may include a touch electrode and touch lines connected to the touch electrode. The touch sensor layer TSL may detect an external input based on a self-capacitance method or a mutual capacitance method.

The touch sensor layer TSL may be disposed on the encapsulation layer 300. In an embodiment, the touch sensor layer TSL may be disposed on or directly disposed on the encapsulation layer 300. An adhesive layer, such as an OCA, may not be between the touch sensor layer TSL and the encapsulation layer 300. In an embodiment, the touch sensor layer TSL may be separately provided on a touch substrate, and connected or coupled on the encapsulation layer 300 by an adhesive layer, such as an OCA.

The optical functional layer OFL may include an anti-reflection layer. The anti-reflection layer may reduce reflectivity of light (external light) incident toward the display apparatus 1 from the outside. In an embodiment, the optical functional layer OFL may include a polarizing film. In an embodiment, the optical functional layer OFL may be provided as a filter plate including a black matrix and color filters.

The cover window CW may be disposed on the display panel 10. The cover window CW may protect the display panel 10. The cover window CW may include at least one of glass, sapphire, and plastic. For example, the cover window CW may include an ultra-thin glass and colorless polyimide (CPI).

The panel protection member PB may be disposed under or below the substrate 100. The panel protection member PB may support and protect the substrate 100. The panel protection member PB may include polyethylene terephthalate or polyimide.

Figure 6:
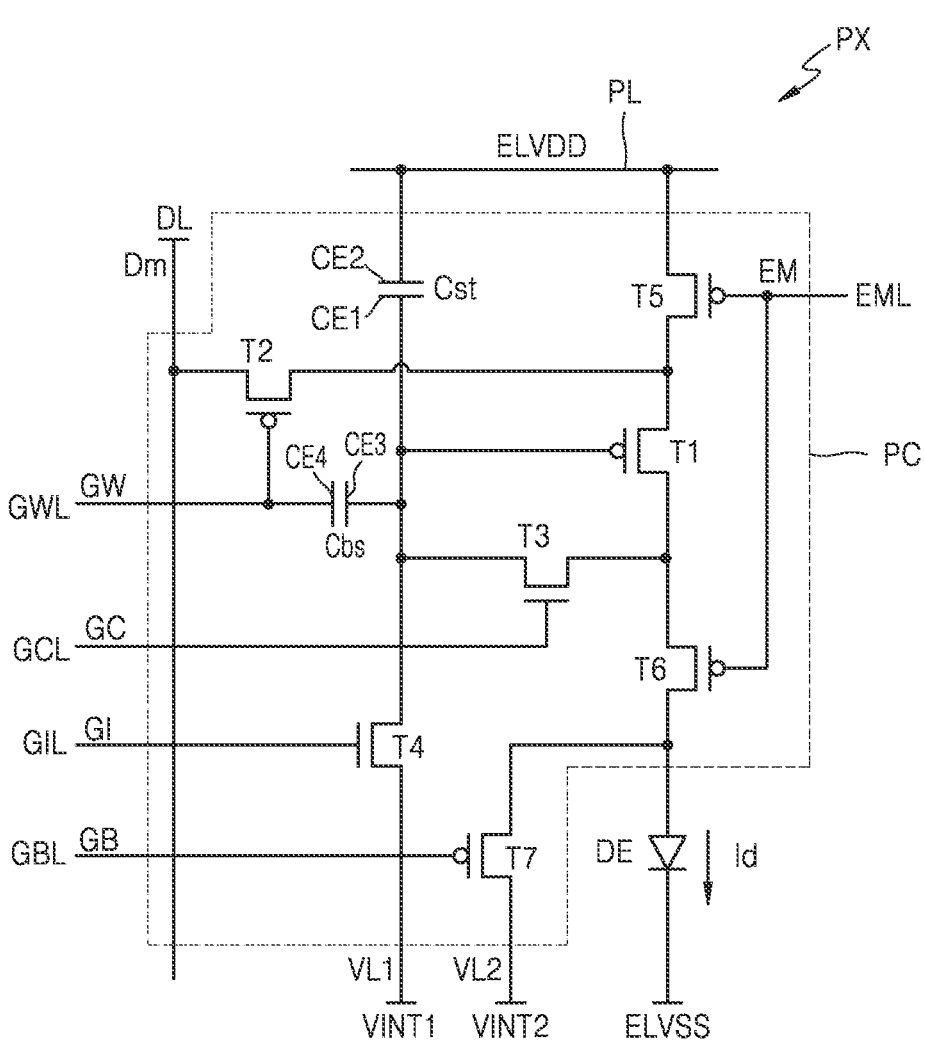
FIG. 6 is a schematic diagram of an equivalent circuit of a pixel according to an embodiment.

FIG. 6 is a schematic diagram of an equivalent circuit of a pixel PX according to an embodiment.

Referring to FIG. 6, the pixel PX is connected to first to fourth scan lines GWL, GCL, GIL, and GBL to transmit first to fourth scan signals GW, GC, GI, and GB, respectively, a data line DL to transmit a data voltage Dm (or a data signal), and an emission control line EML to transmit an emission control signal EM. The pixel PX may be connected to a power line PL to apply a first driving voltage ELVDD, a first voltage line VL1 to apply a first initialization voltage VINT1, and a second voltage line VL2 to apply a second initialization voltage VINT2. The pixel PX may be connected to a common electrode, to which a second driving voltage ELVSS is applied.

Elements included in the pixel PX are described below.

The pixel PX may include a display element DE, first to seventh transistors T1 to T7, a storage capacitor Cst, and a boosting capacitor Cbs. The display element DE may be an OLED having an anode and a cathode. The cathode may be a common electrode, to which the second driving voltage ELVSS is applied.

Some or a number of the first to seventh transistors T1 to T7 may be provided as n-channel metal-oxide-semiconductor field-effect transistors (MOSFET) (NMOS), and the other ones may be provided as p-channel MOSFETs (PMOS). For example, the third transistor T3 and the fourth transistor T4 from among the first to seventh transistors T1 to T7 may be provided as NMOSs, and the other ones may be provided as PMOSs.

In an embodiment, the third transistor T3, the fourth transistor T4, and the seventh transistor T7 from among the first to seventh transistors T1 to T7 may be provided as NMOSs, and the other ones may be provided as PMOSs. In an embodiment, only one of the first to seventh transistors T1 to T7 may be provided as an NMOS, and the other ones may be provided as PMOSs. In an embodiment, the first to seventh transistors T1 to T7 may all be NMOSs or PMOSs.

The first transistor T1 may be a driving transistor in which a magnitude of a drain current is determined according to a gate-source voltage, and the second to seventh transistors T2 to T7 may be switching transistors, which are turned on or off according to a gate-source voltage, substantially a gate voltage.

The first transistor T1 may be referred to as a driving transistor, the second transistor T2 may be referred to as a scan transistor, the third transistor T3 may be referred to as a compensation transistor, the fourth transistor T4 may be referred to as a gate initialization transistor, the fifth transistor T5 may be referred to as a first emission control transistor, the sixth transistor T6 may be referred to as a second emission control transistor, and the seventh transistor T7 may be referred to as an anode initialization transistor.

The storage capacitor Cst may be connected between the power line PL and a gate of the driving transistor T1. The storage capacitor Cst may include a second electrode CE2 and a first electrode CE1, the second electrode CE2 being connected to the power line PL, and the first electrode CE1 being connected to the gate of the driving transistor T1.

The driving transistor T1 may control a magnitude of a driving current Id flowing from the power line PL to the display element DE, according to a gate-source voltage. The driving transistor T1 may include the gate, a source, and a drain, wherein the gate is connected to the first electrode CE1 of the storage capacitor Cst, the source is connected to the power line PL via the first emission control transistor T5, and the drain is connected to the display element DE via the second emission control transistor T6.

The driving transistor T1 may output the driving current Id to the display element DE according to the gate-source voltage. The magnitude of the driving current Id may be determined based on a voltage difference between the gate-source voltage of the driving transistor T1 and a threshold voltage. The display element DE may receive the driving current Id via the driving transistor T1 and emit light with a luminance according to the magnitude of the driving current Id.

The scan transistor T2 may apply the data voltage Dm to the source of the driving transistor T1 in response to the first scan signal GW. The scan transistor T2 may include a gate, a source, and a drain, wherein the gate is connected to the first scan line GWL, the source is connected to the data line DL, and the drain is connected to the source of the driving transistor T1.

The compensation transistor T3 may connect the drain and the gate of the driving transistor T1 to each other in response to the second scan signal GC. The compensation transistor T3 may include a gate, a source, and a drain, wherein the gate is connected to the second scan line GCL, the source is connected to the gate of the driving transistor T1, and the drain is connected to the drain of the driving transistor T1.

The gate initialization transistor T4 may apply the first initialization voltage VINT1 to the gate of the driving transistor T1 in response to the third scan signal GI. The gate initialization transistor T4 may include a gate, a source, and a drain, wherein the gate is connected to the third scan line GIL, the source is connected to the first voltage line VL1, and the drain is connected to the gate of the driving transistor T1.

The anode initialization transistor T7 may apply the second initialization voltage VINT2 to the anode of the display element DE in response to the fourth scan signal GB. The anode initialization transistor T7 may include a gate, a source, and a drain, wherein the gate is connected to the fourth scan line GBL, the source is connected to the anode of the display element DE, and the drain is connected to the second voltage line VL2.

In FIG. 6, the gate initialization transistor T4 and the anode initialization transistor T7 are connected to different voltage lines from each other. However, the gate initialization transistor T4 and the anode initialization transistor T7 may be connected to a same voltage line as each other.

The first emission control transistor T5 may connect the power line PL and the source of the driving transistor T1 to each other in response to the emission control signal EM. The first emission control transistor T5 may include a gate, a source, and a drain, wherein the gate is connected to the emission control line EML, the source is connected to the power line PL, and the drain is connected to the source of the driving transistor T1.

The second emission control transistor T6 may connect the drain of the driving transistor T1 and the anode of the display element DE to each other in response to the emission control signal EM. The second emission control transistor T6 may include a gate, a source, and a drain, wherein the gate is connected to the emission control line EML, the source is connected to the drain of the driving transistor T1, and the drain is connected to the anode of the display element DE.

The first scan signal GW and the second scan signal GC may be substantially synchronized with each other. The third scan signal GI may be substantially synchronized with the first scan signal GW of a previous row. The fourth scan signal GB may be substantially synchronized with the first scan signal GW. In another example, the fourth scan signal GB may be synchronized with the first scan signal GW of a next row.

The boosting capacitor Cbs may include a third electrode CE3 and the fourth electrode CE4, the third electrode CE3 being connected to the first electrode CE1 of the storage capacitor Cst, and the fourth electrode CE4 being connected to the gate of the scan transistor T2. The fourth electrode CE4 of the boosting capacitor Cbs may receive the first scan signal GW. The boosting capacitor Cbs may increase a voltage of a gate (terminal) of the driving transistor T1 at a time point in case that provision of the first scan signal GW is stopped, thereby compensating for a voltage drop of the gate (terminal) of the driving transistor T1.

Hereinafter, a process of operations of the pixel PX as a pixel of an organic light-emitting display apparatus is described in detail.

First, in case that the emission control signal EM of a high level is received, the first emission control transistor T5 and the second emission control transistor T6 may be turned off, the driving transistor T1 may stop outputting the driving current Id, and the display element DE stops emitting light.

Thereafter, during a gate initialization period in which the third scan signal GI of a high level is received, the gate initialization transistor T4 may be turned on, and the first initialization voltage VINT1 may be applied to the gate of the driving transistor T1, for example, the first electrode CE1 of the storage capacitor Cst. A voltage difference (ELVDD–VINT1) between the first driving voltage ELVDD and the first initialization voltage VINT1 may be stored in the storage capacitor Cst.

Thereafter, during a data writing period in which the first scan signal GW of a low level and the second scan signal GC of a high level are received, the scan transistor T2 and the compensation transistor T3 may be turned on, and the data voltage Dm is received by the source of the driving transistor T1. The driving transistor T1 may be diode-connected by the compensation transistor T3 and forward biased. A gate voltage of the driving transistor T1 may rise from the first initialization voltage VINT1. In case that the gate voltage of the driving transistor T1 is equal to a data compensation voltage (Dm–|Vth|), which is obtained by subtracting the data voltage Dm by the threshold voltage Vth of the driving transistor T1, the driving transistor T1 may be turned off, and the gate voltage of the driving transistor T1 stops rising. Accordingly, a voltage difference (ELVDD–Dm+|Vth|) between the first driving voltage ELVDD and the data compensation voltage (Dm–|Vth|) may be stored in the storage capacitor Cst.

During an anode initialization period in which the fourth scan signal GB of a low level is received, the anode initialization transistor T7 may be turned on, and the second initialization voltage VINT2 may be applied to the anode of the display element DE. The second initialization voltage VINT2 may be applied to the anode of the display element DE so that the display element DE totally does not emit light, and thus, a phenomenon in which the display element DE emits light in correspondence with a black grayscale in a next frame may be prevented.

The first scan signal GW and the fourth scan signal GB may be substantially synchronized with each other, and a data writing period and an anode initialization period may be the same period.

Thereafter, in case that the emission control signal EM of a low level is received, the first emission control transistor T5 and the second emission control transistor T6 may be turned on, the driving transistor T1 may output the driving current Id corresponding to the voltage stored in the storage capacitor Cst, for example, the voltage (ELVDD–Dm), which is obtained by subtracting the source-gate voltage (ELVDD–Dm+|Vth|) of the driving transistor T1 by the threshold voltage (|Vth|) of the driving transistor T1, and the display element DE may emit light with a luminance corresponding to the magnitude of the driving current Id.

In an embodiment, at least one of the first to seventh transistors T1 to T7 may include a semiconductor layer including an oxide, and the other ones may include a semiconductor layer including a silicon.

For example, the driving transistor T1, which directly affects a brightness of the display apparatus, may include a semiconductor layer including a polycrystalline silicon that is highly-reliable, so that a high-resolution display apparatus may be implemented.

The oxide semiconductor has high carrier mobility and low leakage current, and thus, voltage drop is not large, even in case that a driving time is long. In other words, even during a low-frequency driving, a color change of a pixel according to a voltage drop is not large, and thus, a display apparatus may be driven at low frequencies.

Because the oxide semiconductor has an advantage of low leakage current, as described above, at least one of the compensation transistor T3, the gate initialization transistor T4, and the anode initialization transistor T7, which are connected to the gate of the driving transistor T1, may be used as the oxide semiconductor, to prevent a leakage current from flowing to the gate of the driving transistor T1 and reduce power consumption.

Figure 7:
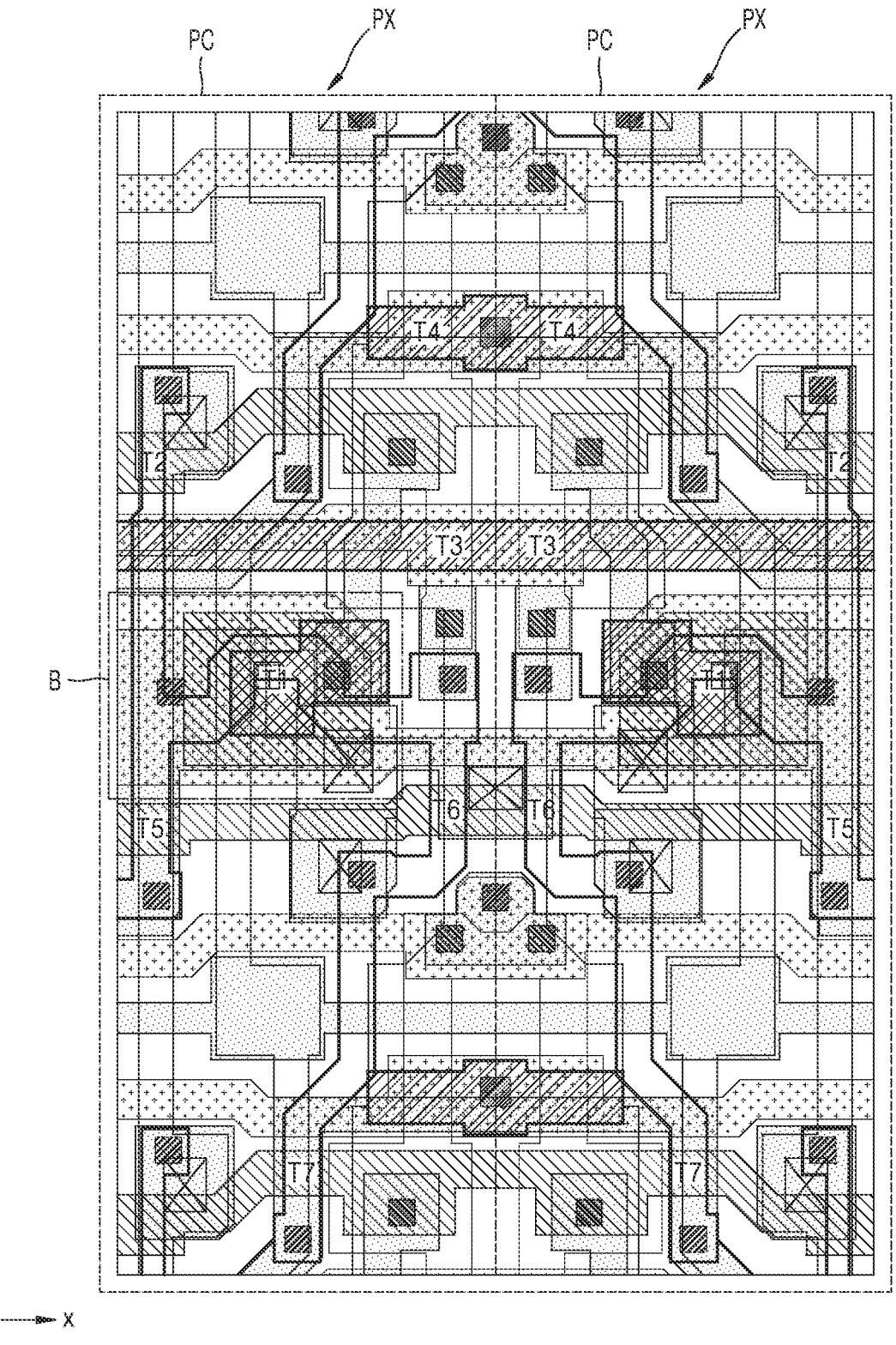
FIG. 7 is a schematic plan view schematically illustrating a pixel circuit according to an embodiment.

FIG. 7 is a schematic plan view schematically illustrating a pixel circuit PC according to an embodiment, and FIGS. 8 to 12 are schematic plan views illustrating some or a number of layers in FIG. 7, as an example.

First, referring to FIG. 7, a display apparatus may include pixels PX adjacent to each other. In an embodiment, the adjacent pixels PX may be symmetrical to each other with respect to a virtual line, as shown in FIG. 7. In an embodiment, the adjacent pixels PX may have a structure in which the same pixel structure is continuously repeated, instead of a symmetrical structure. Each of the pixels PX may include a pixel circuit PC.

For convenience of description, a semiconductor pattern, gate pattern, and electrode of one pixel circuit PC is described below, but the semiconductor pattern, gate pattern, and electrode of a pixel circuit PC adjacent thereto may also be provided symmetrical thereto.

Figure 8:
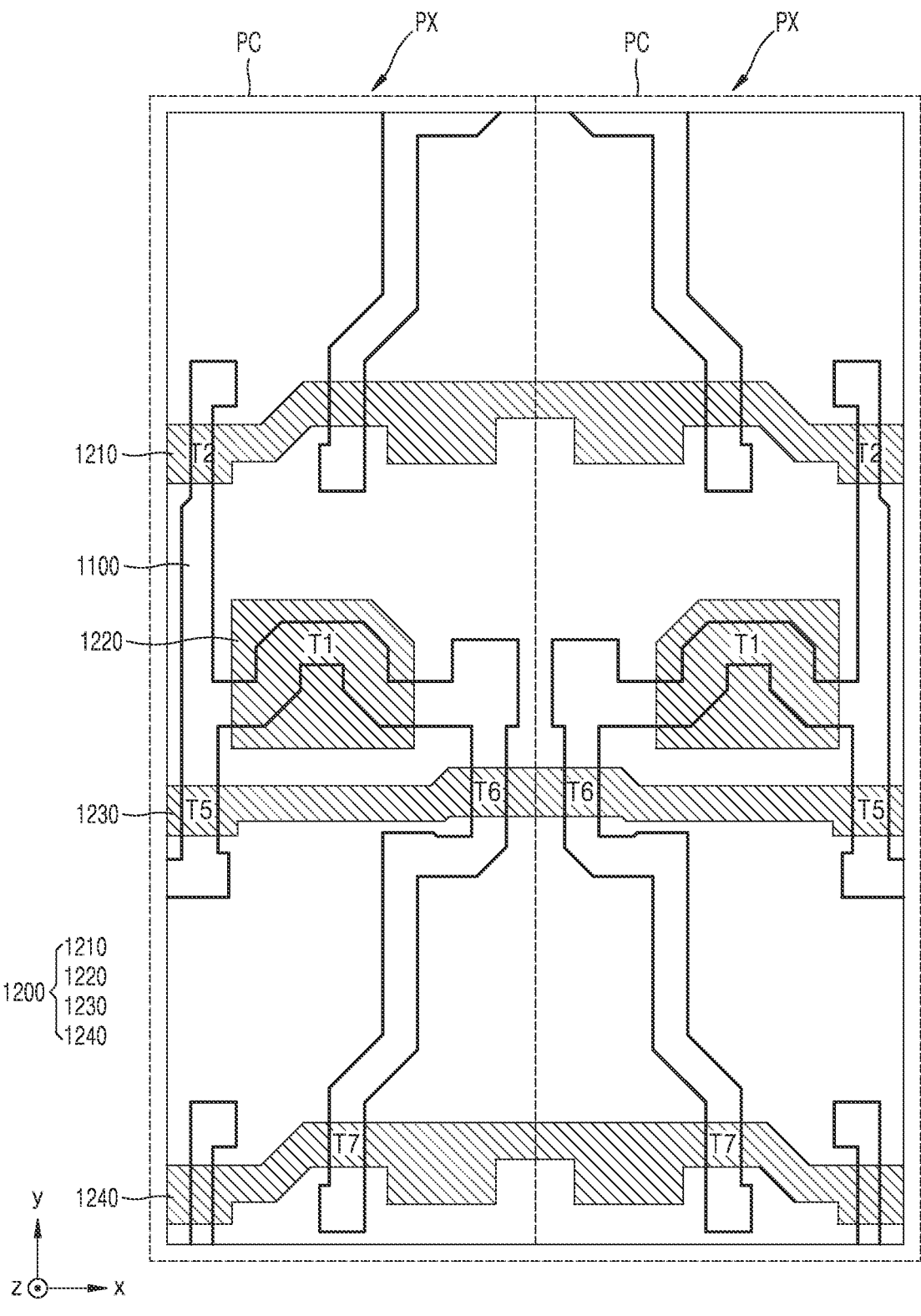
FIGS. 8 to 12 are schematic plan views illustrating some layers in FIG. 7 as an example.

Referring to FIG. 8, the pixel circuit PC may include a first semiconductor pattern 1100 and a first gate pattern 1220 and be electrically connected to a first conductive line 1210, a second conductive line 1230, and a third conductive line 1240 each extending in the first direction (for example, the ±x direction). The first conductive line 1210 may correspond to the first scan line GWL in FIG. 6, the second conductive line 1230 may correspond to the emission control line EML in FIG. 6, and the third conductive line 1240 may correspond to the fourth scan line GBL in FIG. 6.

The first semiconductor pattern 1100 may include a silicon semiconductor. For example, the first semiconductor pattern 1100 may include amorphous silicon or polysilicon. For example, the first semiconductor pattern 1100 may include polysilicon crystallized at a low temperature. If necessary, ions may be injected into at least a portion of the first semiconductor pattern 1100.

A first conductive layer 1200, which may include the first gate pattern 1220, the first conductive line 1210, the second conductive line 1230, and the third conductive line 1240, may be disposed over the first semiconductor pattern 1100. An insulating layer may be between the first semiconductor pattern 1100 and the first conductive layer 1200. The first conductive layer 1200 may include molybdenum (Mo), aluminum (Al), copper (Cu), titanium (Ti), within the spirit and the scope of the disclosure, and may include a layer or layers. For example, the first conductive layer 1200 may include a single Mo layer.

A portion of the first conductive line 1210 overlapping the first semiconductor pattern 1100 may correspond to the gate of the scan transistor T2. Portions of the second conductive line 1230 overlapping the first semiconductor pattern 1100 may correspond to the gate of the first emission control transistor T5 and the gate of the second emission control transistor T6, respectively. A portion of the third conductive line 1240 overlapping the first semiconductor pattern 1100 may correspond to the gate of the anode initialization transistor T7. The first gate pattern 1220 may correspond to the gate of the driving transistor T1 (or the first electrode CE1 of the storage capacitor Cst in FIG. 6).

Figure 9:
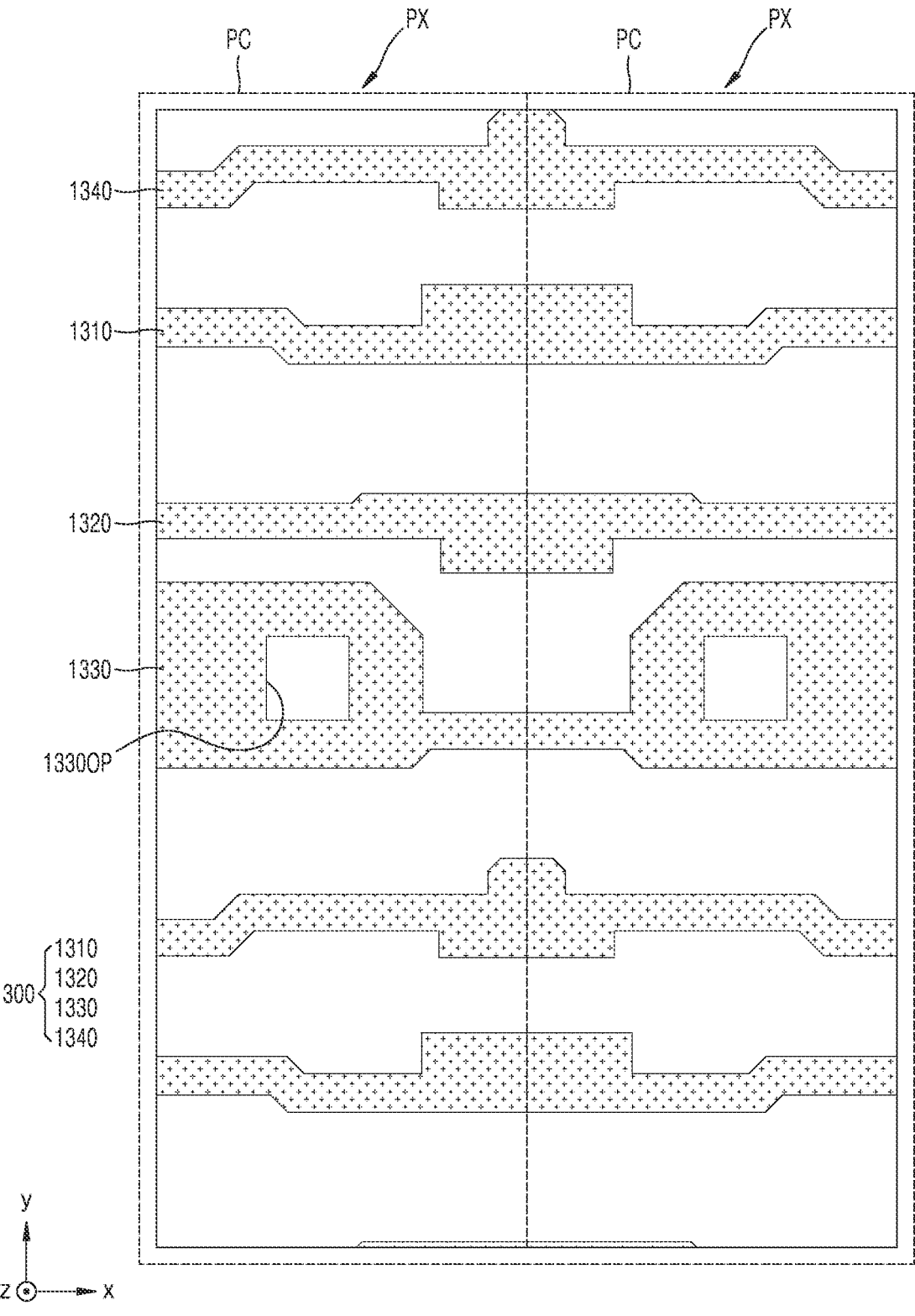

Referring to FIG. 9, the pixel circuit PC may include a storage electrode 1330 and be electrically connected to a fourth conductive line 1310, a fifth conductive line 1320, and a sixth conductive line 1340 each extending in the first direction (for example, the ±x direction). The storage electrode 1330 may correspond to the second electrode CE2 of the storage capacitor Cst in FIG. 6, the fourth conductive line 1310 may correspond to the third scan line GIL in FIG. 6, the fifth conductive line 1320 may correspond to the second scan line GCL in FIG. 6, and the sixth conductive line 1340 may correspond to the first voltage line VL1 in FIG. 6.

A second conductive layer 1300, which may include the storage electrode 1330, the fourth conductive line 1310, the fifth conductive line 1320, and the sixth conductive line 1340, may be disposed on the first conductive layer 1200. An insulating layer may be between the first conductive layer 1200 and the second conductive layer 1300. The storage electrode 1330 may have an opening 13300P, which exposes a portion of the insulating layer.

Figure 10:
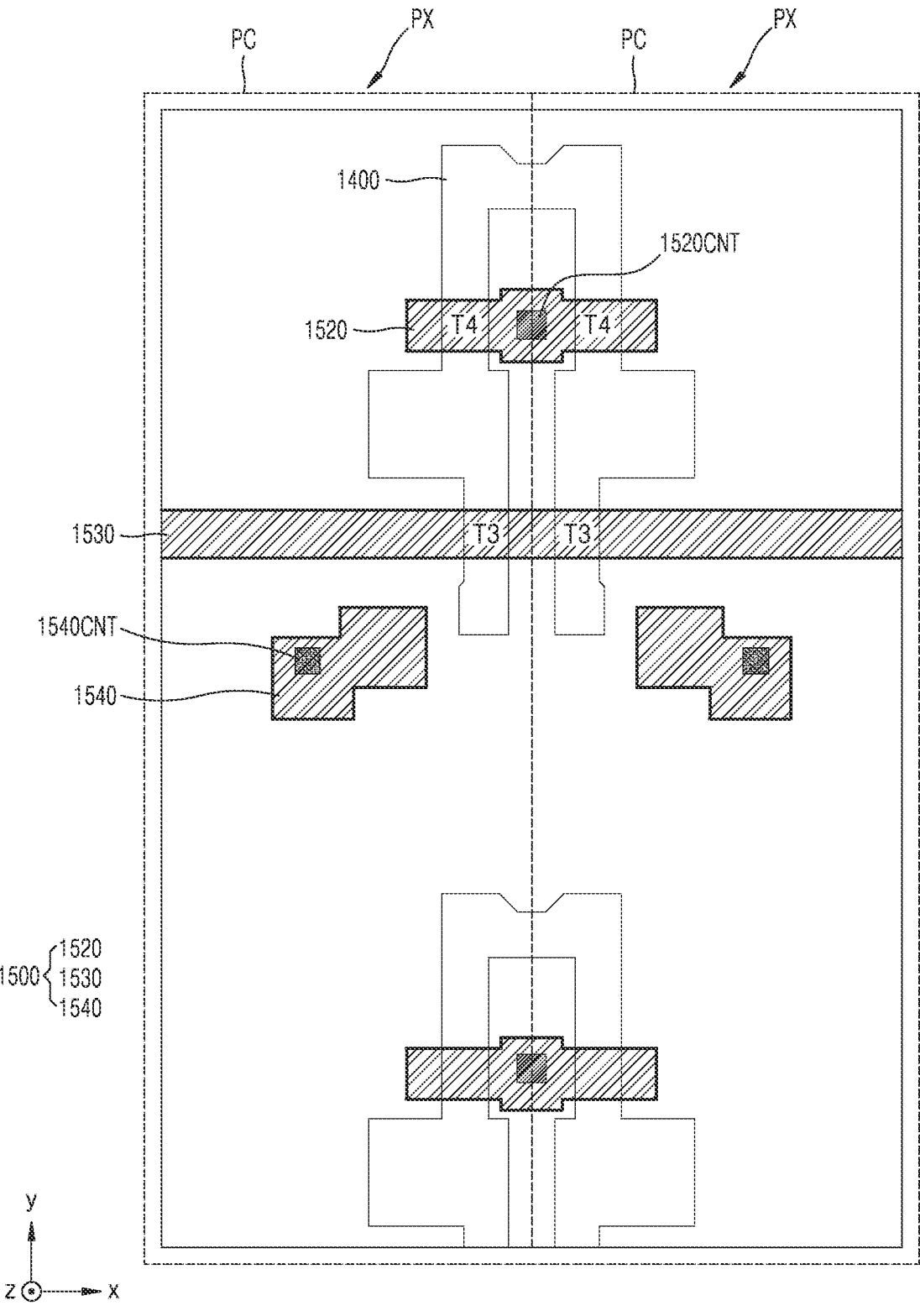

Referring to FIG. 10, the pixel circuit PC may include a second semiconductor pattern 1400, a second gate pattern 1520, and a first connection pattern 1540, and may be electrically connected to a seventh conductive line 1530 extending in the first direction (for example, the ±x direction). The seventh conductive line 1530 may correspond to the second scan line GCL in FIG. 6. The fifth conductive line 1320 and the seventh conductive line 1530 may constitute a double scan line.

The second semiconductor pattern 1400 may be disposed on the second conductive layer 1300. An insulating layer may be between the second conductive layer 1300 and the second semiconductor pattern 1400. The second semiconductor pattern 1400 may include an oxide of at least one material selected from the group consisting of indium (In), gallium (Ga), stannum (Sn), zirconium (Zr), vanadium (V), hafnium (Hf), cadmium (Cd), germanium (Ge), chrome (Cr), Ti, Al, cesium (Cs), cerium (Ce), and zinc (Zn). For example, the second semiconductor pattern 1400 may include an InSnZnO (ITZO) semiconductor layer, an InGaZnO (IGZO) layer, within the spirit and the scope of the disclosure.

A third conductive layer 1500, which may include the second gate pattern 1520, the first connection pattern 1540, and the seventh conductive line 1530, may be disposed on the second semiconductor pattern 1400. An insulating layer may be between the second semiconductor pattern 1400 and the third conductive layer 1500. The third conductive layer 1500 may include Mo, Al, Cu, Ti, within the spirit and the scope of the disclosure, and may include a layer or layers. For example, the third conductive layer 1500 may have a multi-layer structure of a Mo layer and a Ti layer.

A portion of the second gate pattern 1520 overlapping the second semiconductor pattern 1400 may correspond to the gate of the gate initialization transistor T4. A portion of the seventh conductive line 1530 overlapping the second semiconductor pattern 1400 may correspond to the gate of the compensation transistor T3.

The second gate pattern 1520 may be connected to the fourth conductive line 1310 of the second conductive layer 1300 via a first contact hole 1520CNT. The first connection pattern 1540 may be connected to the first gate pattern 1220 of the first conductive layer 1200 via a second contact hole 1540CNT. The second contact hole 1540CNT may pass through the opening 13300P defined in the storage electrode 1330 of the second conductive layer 1300.

Figure 11:
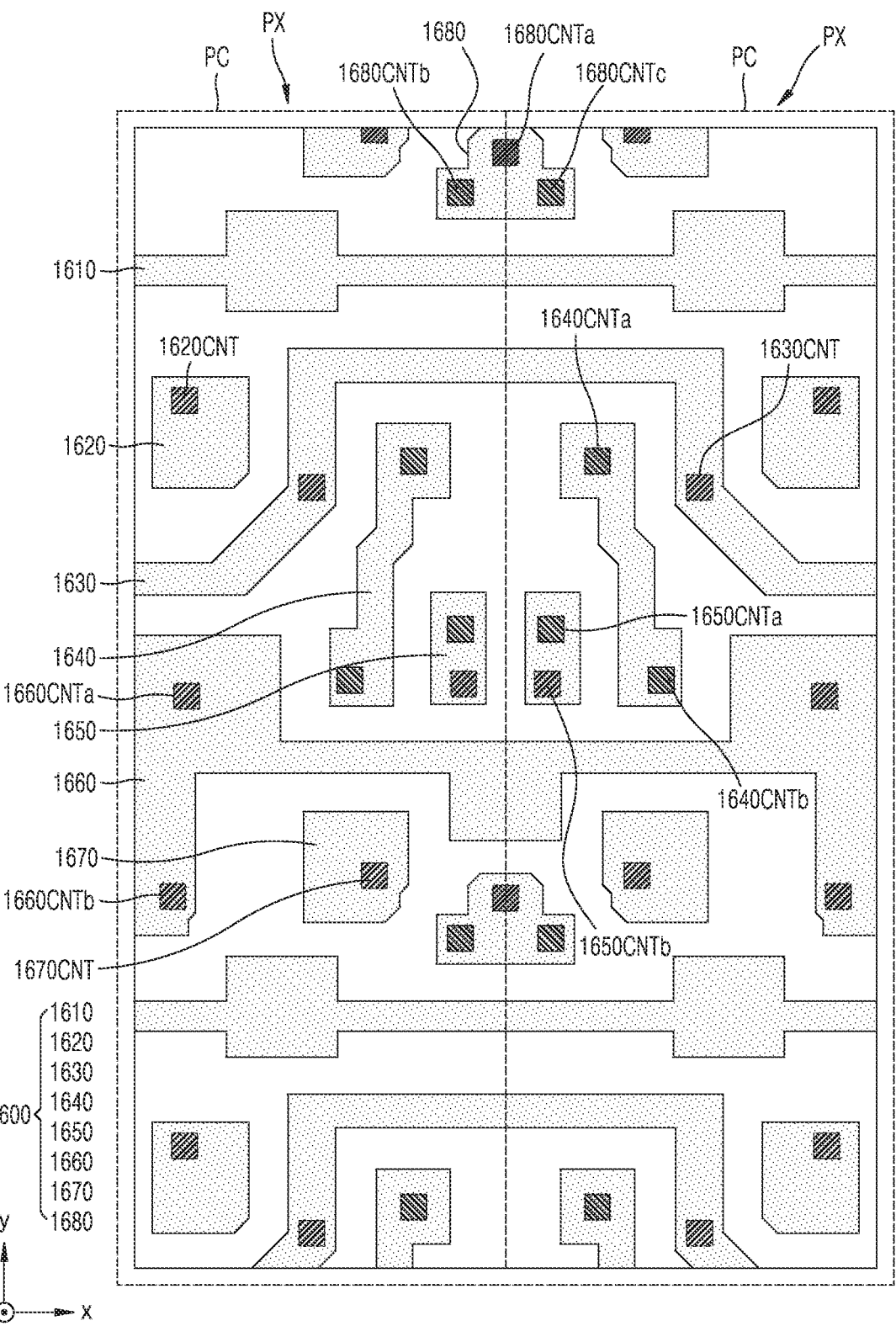

Referring to FIG. 11, the pixel circuit PC may include a second connection pattern 1620, a third connection pattern 1640, a fourth connection pattern 1650, a fifth connection pattern 1670, and a sixth connection pattern 1680, and be electrically connected to an eighth conductive line 1630 and a ninth conductive line 1660 each extending in the first direction (for example, the ±x direction). A tenth conductive line 1610 may pass through the pixel circuit PC. The eighth conductive line 1630 may correspond to the second voltage line VL2 in FIG. 6, and the ninth conductive line 1660 may correspond to the power line PL in FIG. 6.

In FIG. 11, the ninth conductive line 1660 extends in the first direction (for example, the ±x direction) and is connected to the pixel circuits PC, which are arranged in a same row as each other. However, in an embodiment, the ninth conductive line 1660 may include connection patterns. The connection patterns may be arranged in each pixel circuit or in each of pixel circuits adjacent to each other.

In FIG. 11, the tenth conductive line 1610 passes through the pixel circuit PC. However, in an embodiment, the tenth conductive line 1610 may be connected to a conductive line or connection pattern.

A fourth conductive layer 1600, which may include the second connection pattern 1620, the third connection pattern 1640, the fourth connection pattern 1650, the fifth connection pattern 1670, the sixth connection pattern 1680, the eighth conductive line 1630, the ninth conductive line 1660, and the tenth conductive line 1610, may be disposed on the third conductive layer 1500. An insulating layer may be between the third conductive layer 1500 and the fourth conductive layer 1600. The fourth conductive layer 1600 may include Mo, Al, Cu, Ti, within the spirit and the scope of the disclosure, and may include a layer or layers. For example, the fourth conductive layer 1600 may include layers of a Ti layer, an Al layer, and another Ti layer.

The second connection pattern 1620 may be connected to the first semiconductor pattern 1100 via a third contact hole 1620CNT. The third connection pattern 1640 may be connected to the second semiconductor pattern 1400 via a $4^{th}$-$1^{st}$ contact hole 1640CNTa, and may be connected to the first connection pattern 1540 of the third connection pattern 1640 via a $4^{th}$-$2^{nd}$ contact hole 1640CNTb. The fourth connection pattern 1650 may be connected to the second semiconductor pattern 1400 via a $5^{th}$-$1^{st}$ contact hole 1650CNTa, and may be connected to the first semiconductor pattern 1100 via a $5^{th}$-$2^{nd}$ contact hole 1650CNTb. The fifth connection pattern 1670 may be connected to the first semiconductor pattern 1100 via a sixth contact hole 1670CNT. The sixth connection pattern 1680 may be connected to the sixth conductive line 1340 of the second conductive layer 1300 via a $7^{th}$-$1^{st}$ contact hole 1680CNTa, and may be connected to the second semiconductor pattern 1400 via a $7^{th}$-$2^{nd}$ contact hole 1680CNTb and $7^{th}$-$3^{rd}$ contact hole 1680CNTc. The eighth conductive line 1630 may be connected to the first semiconductor pattern 1100 via an eighth contact hole 1630CNT. The ninth conductive line 1660 may be connected to the storage electrode 1330 of the second conductive layer 1300 via a $9^{th}$-$1^{st}$ contact hole 1660CNTa, and may be connected to the first semiconductor pattern 1100 via a $9^{th}$-$2^{nd}$ contact hole 1660CNTb.

Figure 12:
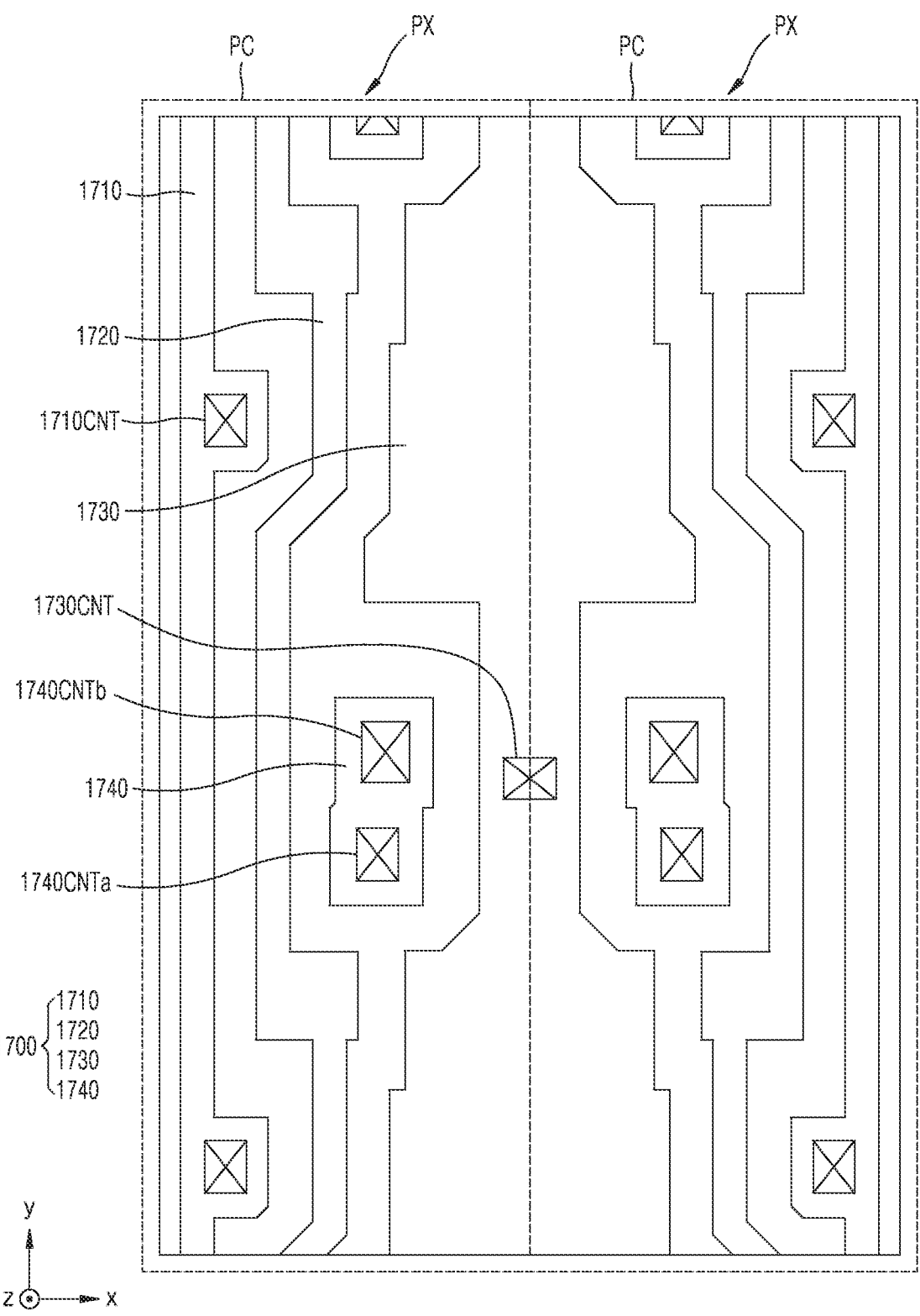

Referring to FIG. 12, the pixel circuit PC may include a seventh connection pattern 1740 and be electrically connected to an eleventh conductive line 1710 and a twelfth conductive line 1730 each extending in the second direction (for example, the ±y direction). A thirteenth conductive line 1720 may pass through the pixel circuit PC. The eleventh conductive line 1710 may correspond to the data line DL in FIG. 6, and the twelfth conductive line 1730 may correspond to the power line PL in FIG. 6. The ninth conductive line 1660 and the twelfth conductive line 1730 may constitute a power line having a mesh structure.

In FIG. 12, the thirteenth conductive line 1720 passes through the pixel circuit PC. However, in an embodiment, the thirteenth conductive line 1720 may be connected to a conductive line or connection pattern. For example, the thirteenth conductive line 1720 may be connected to the tenth conductive line 1610.

A fifth conductive layer 1700, which may include the seventh connection pattern 1740, the eleventh conductive line 1710, the twelfth conductive line 1730, and the thirteenth conductive line 1720, may be disposed on the fourth conductive layer 1600. An insulating layer may be between the fourth conductive layer 1600 and the fifth conductive layer 1700. The fifth conductive layer 1700 may include Mo, Al, Cu, Ti, within the spirit and the scope of the disclosure, and may include a layer or layers. For example, the fifth conductive layer 1700 may include layers of a Ti layer, an Al layer, and another Ti layer.

The seventh connection pattern 1740 may be connected to the fifth connection pattern 1670 of the fourth conductive layer 1600 via a $10^{th}$-$1^{st}$ contact hole 1740CNTa, and may be connected to the anode of the display element via a $10^{th}$-$2^{nd}$ contact hole 1740CNTb. The eleventh conductive line 1710 may be connected to the second connection pattern 1620 of the fourth conductive layer 1600 via an eleventh contact hole 1710CNT. The twelfth conductive line 1730 may be connected to the ninth conductive line 1660 of the fourth conductive layer 1600 via a twelfth contact hole 1730CNT.

Figure 13:
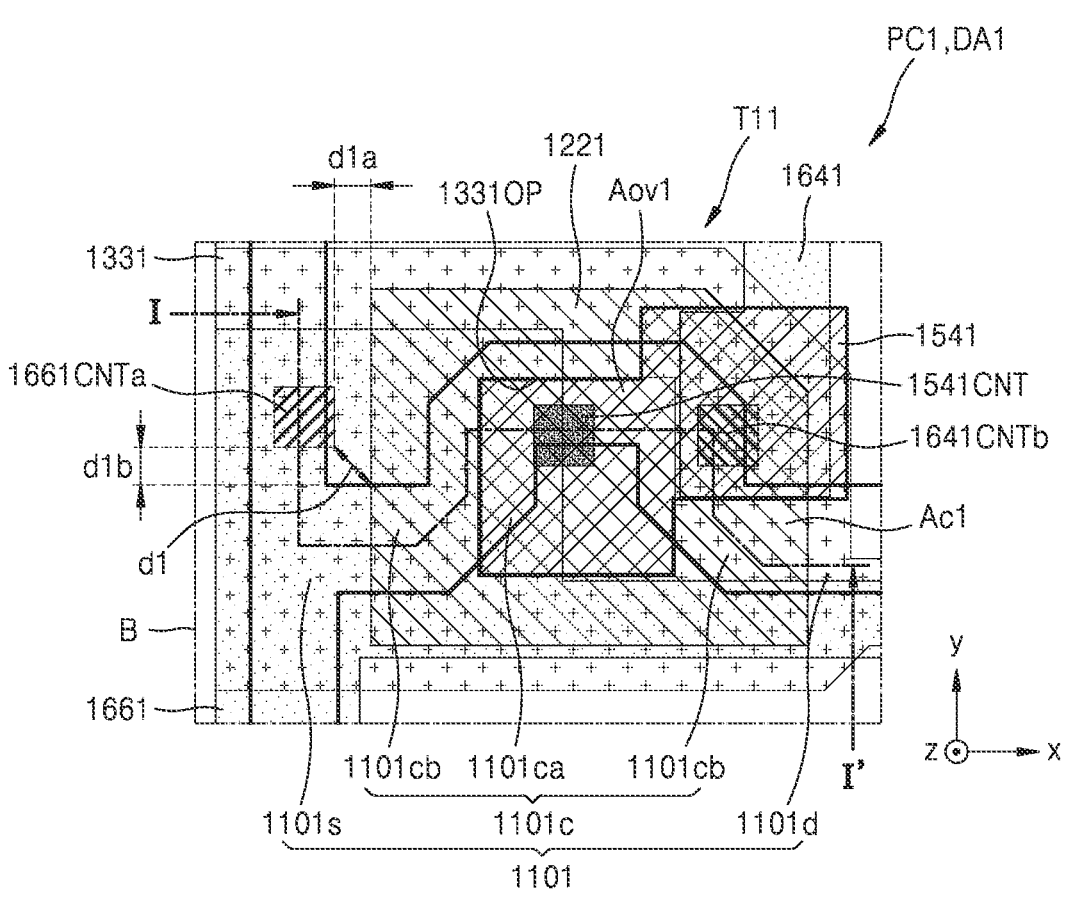
FIG. 13 is an enlarged schematic plan view illustrating region B in FIG. 7 as an example.

FIG. 13 is an enlarged schematic plan view illustrating region B in FIG. 7 as an example. In detail, FIG. 13 is an enlarged schematic plan view illustrating an example of a portion of the first pixel circuit PC1 which is arranged in the first display region DA1 and corresponds to region B in FIG. 7.

Referring to FIG. 13, the first pixel circuit PC1 may include a first semiconductor layer 1101, a first gate electrode 1221, a first electrode 1541, a first connection electrode 1641, a third electrode 1331, and a first conductive pattern 1661. The first semiconductor layer 1101 may correspond to the first semiconductor pattern 1100 in FIG. 8, the first gate electrode 1221 may correspond to the first gate pattern 1220 in FIG. 8, the first electrode 1541 may correspond to the first connection pattern 1540 in FIG. 10, the first connection electrode 1641 may correspond to the third connection pattern 1640 in FIG. 11, the third electrode 1331 may correspond to the storage electrode 1330 in FIG. 9, and the first conductive pattern 1661 may correspond to the ninth conductive line 1660 in FIG. 11.

The first semiconductor layer 1101 may include a silicon semiconductor. For example, the first semiconductor layer 1101 may include amorphous silicon or polysilicon. The first semiconductor layer 1101 may include a first source region 1101s, a first drain region 1101d, and a first channel region 1101c, the first channel region 1101c being between the first source region 1101s and the first drain region 1101d. The first source region 1101s and the first drain region 1101d may be regions doped by adding dopants. A portion of the first semiconductor layer 1101 may have an omega (1) shape. The first channel region 1101c of the first semiconductor layer 1101 may have an omega (1) shape.

The first gate electrode 1221 may be disposed (or located) on the first gate electrode 1221 and overlap the first channel region 1101c. The first gate electrode 1221 may include Mo, Al, Cu, Ti, within the spirit and the scope of the disclosure, and may include a layer or layers. For example, the first gate electrode 1221 may include a single Mo layer.

The first electrode 1541 may be disposed (or located) on the first gate electrode 1221 and connected to the first gate electrode 1221. The first electrode 1541 may be connected to the first gate electrode 1221 via a third contact hole 1541CNT. The third contact hole 1541CNT may pass through an opening 1331OP defined in the third electrode 1331 to be described later. The first electrode 1541 may include Mo, Al, Cu, Ti, within the spirit and the scope of the disclosure, and may include a layer or layers. For example, the first electrode 1541 may have a multi-layer structure of a Mo layer and a Ti layer.

In an embodiment, at least a portion of the first electrode 1541 may overlap the first channel region 1101c of the first semiconductor layer 1101. The first channel region 1101c may include a first overlapping region 1101ca and a first non-overlapping region 1101cb, the first overlapping region 1101ca overlapping the first electrode 1541, and the first non-overlapping region 1101cb not overlapping the first electrode 1541.

The first connection electrode 1641 may be disposed on the first electrode 1541. The first connection electrode 1641 may connect the first electrode 1541 and a third semiconductor layer 1401 to each other, as described later with reference to FIG. 14. The first connection electrode 1641 may be connected to the third semiconductor layer 1401 via a $5^{th}$-$1^{st}$ contact hole 1641CNTa, and may be connected to the first electrode 1541 via a $5^{th}$-$2^{nd}$ contact hole 1641CNTb.

The third semiconductor layer 1401 may include a different material from a material of the first semiconductor layer 1101. For example, the third semiconductor layer 1401 may include an oxide semiconductor material. The first connection electrode 1641 may include Mo, Al, Cu, Ti, within the spirit and the scope of the disclosure, and may include a layer or layers. For example, the first connection electrode 1641 may include layers of a Ti layer, an Al layer, and another Ti layer.

The third electrode 1331 may be located between the first gate electrode 1221 and the first electrode 1541. The third electrode 1331 may have the opening 13310P that exposes a portion of an insulating layer located between the first gate electrode 1221 and the third electrode 1331. The third electrode 1331 may include Mo, Al, Cu, Ti, within the spirit and the scope of the disclosure, and may include a layer or layers. For example, the third electrode 1331 may include a single Mo layer.

The first conductive pattern 1661 may be disposed on the first electrode 1541. The first driving voltage ELVDD (see FIG. 6) may be applied to the first conductive pattern 1661. The first conductive pattern 1661 may be connected to the third electrode 1331 via a first contact hole 1661CNTa. The first conductive pattern 1661 may include Mo, Al, Cu, Ti, within the spirit and the scope of the disclosure, and may include a layer or layers. For example, the first conductive pattern 1661 may include layers of a Ti layer, an Al layer, and another Ti layer.

The first pixel circuit PC1 may include a first driving transistor T11 including the first gate electrode 1221 and a portion of the first semiconductor layer 1101. The first driving transistor T11 may output the first driving current to the first display element DE1 (see FIG. 3) electrically connected to the first pixel circuit PC1.

Figure 14:
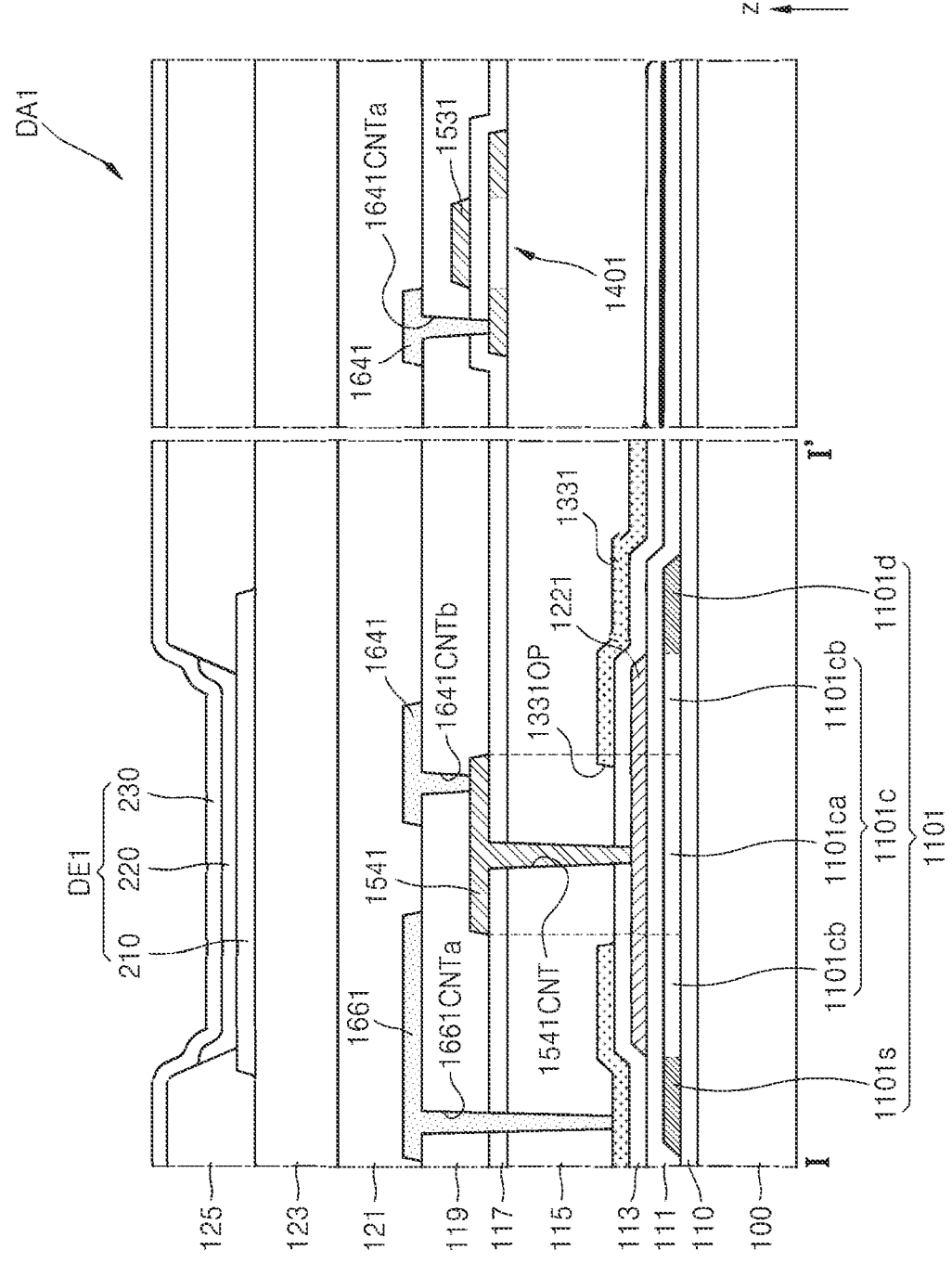
FIG. 14 is a schematic cross-sectional view of a portion of FIG. 13, taken along line I-I' in FIG. 13, as an example.

FIG. 14 is a schematic cross-sectional view of a portion of FIG. 13, taken along line I-I' in FIG. 13, as an example. Elements included in the display apparatus are described in greater detail below, with reference to FIG. 14, according to a stacked structure thereof.

The substrate 100 may include a glass material, a ceramic material, or a metal material. The substrate 100 may include a material that is flexible or bendable. In case that the substrate 100 is flexible or bendable, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may include a layer or layers of the material described above, and in case that the substrate 100 has layers, the substrate 100 may further include an inorganic layer. In an embodiment, the substrate 100 may have a structure of an organic material, an inorganic material, and another organic material.

A buffer layer 110 may reduce or block permeation of impurities, moisture, or ambient air from a lower portion of the substrate 100 and provide a flat surface on the substrate 100. The buffer layer 110 may include an inorganic material, such as an oxide or nitride, an organic material, or an organic-inorganic composite material, and may have a layer or layers of an inorganic material and an organic material.

A barrier layer (not shown) may be further included between the substrate 100 and the buffer layer 110. The barrier layer may prevent or minimize permeation of impurities from the substrate 100 or the like, into the first semiconductor layer 1101 and the third semiconductor layer 1401. The barrier layer may include an inorganic material, such as an oxide or nitride, an organic material, or an organic-inorganic composite material, and may have a layer or layers of an inorganic material and an organic material.

The first semiconductor layer 1101 may be disposed on the buffer layer 110. The first semiconductor layer 1101 may include amorphous silicon, or may include polysilicon. The first semiconductor layer 1101 may include the first channel region 1101c, the first source region 1101s, and the first drain region 1101d, the first source region 1101s and the first drain region 1101d being arranged at opposite sides of the first channel region 1101c, respectively. The first source region 1101s and the first drain region 1101d may be regions doped by adding dopants. The first semiconductor layer 1101 may include a layer or layers.

A first insulating layer 111 and a second insulating layer 113 may be stacked each other on the substrate 100 to cover the first semiconductor layer 1101. Each of the first insulating layer 111 and the second insulating layer 113 may include silicon oxide ($SiO_2$), silicon nitride ($SiN_x$), SiON, aluminum oxide ($Al_2O_3$), titanium oxide ($TiO_2$), tantalum oxide ($Ta_2O_5$), hafnium oxide ($HfO_2$), or zinc oxide ($ZnO_x$). $ZnO_x$ may be ZnO and/or $ZnO_2$.

The first gate electrode 1221 may be disposed on the first insulating layer 111. The first gate electrode 1221 may include a conductive material, such as Mo, Al, Cu, Ti, and the like, and may include a layer or layers including the material described above.

The third electrode 1331 may be disposed on the second insulating layer 113. The third electrode 1331 may include a conductive material, such as Mo, Al, Cu, Ti, and the like, and may include a layer or layers including the material described above.

The first gate electrode 1221 and the third electrode 1331 may overlap each other with the second insulating layer 113 therebetween and form capacitance. The second insulating layer 113 may act as a dielectric layer of the storage capacitor Cst (see FIG. 6).

A third insulating layer 115 may be disposed on the second insulating layer 113 to cover the third electrode 1331. The third insulating layer 115 may include $SiO_2$, $SiN_x$, SiON, $Al_2O_3$, $TiO_2$, $Ta_2O_5$, $HfO_2$, or $ZnO_x$. ZnO may be ZnO and/or $ZnO_2$.

The third semiconductor layer 1401 may be disposed on the third insulating layer 115. The third semiconductor layer 1401 may include an oxide semiconductor material. For example, the third semiconductor layer 1401 may include an oxide of at least one material selected from the group consisting of In, Ga, Sn, Zr, V, Hf, Cd, Ge, Cr, Ti, Al, Cs, Ce, and Zn.

For example, the third semiconductor layer 1401 may include an ITZO semiconductor layer, an IGZO semiconductor layer, within the spirit and the scope of the disclosure. Because the oxide semiconductor has a large band gap (about 3.1 eV), high carrier mobility, and low leakage current, a voltage drop is not large even in case that a driving time is long, and thus, a change of luminance due to the voltage drop is not large, even in case that the display apparatus is driven at low frequencies.

The third semiconductor layer 1401 may include a channel region, a source region, and a drain region, the source region and the drain region being arranged at opposite sides of the channel region, respectively. The third semiconductor layer 1401 may include a layer or layers.

A fourth insulating layer 117 may be disposed on the third semiconductor layer 1401. The fourth insulating layer 117 may include $SiO_2$, $SiN_x$, SiON, $Al_2O_3$, $TiO_2$, $Ta_2O_5$, $HfO_2$, or $ZnO_x$. $ZnO_x$ may be ZnO and/or $ZnO_2$.

In FIG. 14, the fourth insulating layer 117 is arranged on an entire surface of the substrate 100 to cover the third semiconductor layer 1401. However, in an embodiment, the fourth insulating layer 117 may be patterned to overlap a portion of the third semiconductor layer 1401. For example, the fourth insulating layer 117 may be patterned to overlap the channel region of the third semiconductor layer 1401.

The first electrode 1541 and a first gate line 1531 may be disposed on the fourth insulating layer 117. Each of the first electrode 1541 and the first gate line 1531 may include a conductive material, such as Mo, Al, Cu, and Ti, and may include a layer or layers including the material described above.

The first electrode 1541 may be connected to the first gate electrode 1221 via the third contact hole 1541CNT, which is defined in the second insulating layer 113, the third insulating layer 115, and the fourth insulating layer 117. The third contact hole 1541CNT may pass through the opening 13310P defined in the third electrode 1331.

In an embodiment, at least a portion of the first electrode 1541 may overlap the first channel region 1101$c$ of the first semiconductor layer 1101. The first channel region 1101$c$ may include a first overlapping region 1101$ca$ and a first non-overlapping region 1101$cb$, the first overlapping region 1101$ca$ overlapping the first electrode 1541, and the first non-overlapping region 1101$cb$ not overlapping the first electrode 1541.

The first gate line 1531 may at least partially overlap the third semiconductor layer 1401. The first gate line 1531 may overlap the channel region of the third semiconductor layer 1401. The first gate line 1531 may correspond to the seventh conductive line 1530 in FIG. 10.

A fifth insulating layer 119 may be provided on the fourth insulating layer 117 to cover the first electrode 1541 and the first gate line 1531. The fifth insulating layer 119 may include $SiO_2$, $SiN_x$, SiON, $Al_2O_3$, $TiO_2$, $Ta_2O_5$, $HfO_2$, or $ZnO_x$. $ZnO_2$, may be ZnO and/or $ZnO_2$.

The first connection electrode 1641 and the first conductive pattern 1661 may be disposed on the fifth insulating layer 119. Each of the first connection electrode 1641 and the first conductive pattern 1661 may include a conductive material, such as Mo, Al, Cu, and Ti, and may include a layer or layers including the material described above.

The first connection electrode 1641 may be connected to the third semiconductor layer 1401 via the $5^{th}$-$1^{st}$ contact hole 1641CNTa, which is defined in the fourth insulating layer 117 and the fifth insulating layer 119. The first connection electrode 1641 may be connected to the first electrode 1541 via the $5^{th}$-$2^{nd}$ contact hole 1641CNTb defined in the fifth insulating layer 119. The first connection electrode 1641 may connect the third semiconductor layer 1401 and the first electrode 1541 to each other.

The first conductive pattern 1661 may be connected to the third electrode 1331 via a first contact hole 1661CNTa, which is defined in the third insulating layer 115, the fourth insulating layer 117, and the fifth insulating layer 119.

A first planarization layer 121 and a second planarization layer 123 may be disposed in a stacked structure on the fifth insulating layer 119. Each of the first planarization layer 121 and the second planarization layer 123 may include a layer or layers of an inorganic material, and a flat upper surface may be provided thereon. Each of the first planarization layer 121 and the second planarization layer 123 may include a general-purpose polymer, such as benzocyclobutene (BCB), polyimide, hexamethyldisiloxane (HMDSO), polymethylmethacrylate (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any blends thereof.

Although not shown in FIG. 14, the fifth conductive layer 1700 of FIG. 12 may be between the first planarization layer 121 and the second planarization layer 123.

Also, in FIG. 14, two planarization layers are disposed on the fifth insulating layer 119. However, in an embodiment, three or more planarization layers may be disposed on the fifth insulating layer 119. In an embodiment, one planarization layer may be disposed on the fifth insulating layer 119.

The first display element DE1 electrically connected to the first pixel circuit PC1 (see FIG. 13) may be disposed on the second planarization layer 123. The first display element DE1 may include a pixel electrode 210, an intermediate layer 220, and an opposite electrode 230, the intermediate layer 220 including an organic emission layer.

The pixel electrode 210 may include a (semi-)light-transmitting layer or a reflective layer. In an embodiment, the pixel electrode 210 may include a reflective layer and a transparent or semi-transparent electrode layer, the reflective layer including silver (Ag), magnesium (Mg), Al, platinum (Pt), palladium (Pd), gold (Au), nickel (Ni), neodymium (Nd), iridium (Ir), Cr, or a compound thereof, and the semi-transparent electrode layer being disposed on the reflective layer. The transparent or semi-transparent electrode layer may include at least one selected from the group consisting of ITO, IZO, ZnO, $In_2O_3$, IGO, and AZO. In an embodiment, the pixel electrode 210 may have a stacked structure of an ITO layer, an Ag layer, and another ITO layer.

A pixel-defining layer 125 may be disposed on the second planarization layer 123. The pixel-defining layer 125 may increase a distance between an edge of the pixel electrode 210 and the opposite electrode 230, which is on the pixel electrode 210, thereby preventing an arc or the like from occurring at the edge of the pixel electrode 210.

The pixel-defining layer 125 may include at least one organic insulating material selected from the group consisting of polyimide, polyamide, an acrylic resin, BCB, and a phenolic resin, and may be provided by spin coating or the like within the spirit and the scope of the disclosure. The pixel-defining layer 125 may include an organic insulating material. In an embodiment, the pixel-defining layer 125 may include an inorganic insulating material, such as $SiN_x$, SiON, or $SiO_2$. In an embodiment, the pixel-defining layer 125 may include an organic insulating material and an inorganic insulating material. In an embodiment, the pixel-defining layer 125 may include a light-shielding material and be provided in black. For example, the light-shielding material may include carbon black, carbon nanotubes, a resin or paste including black dye, metal particles, such as Ni, Al, Mo, and an alloy thereof, metal oxide particles (for example, a chrome oxide), or metal nitride particles (for example, a chrome nitride). In case that the pixel-defining layer 125 may include a light-shielding material, external-light reflection due to metal structures disposed under or below the pixel-defining layer 125 may be reduced.

The intermediate layer 220 may be arranged in an opening provided by the pixel-defining layer 125. The intermediate layer 220 may include an organic emission layer. The organic emission layer may include an organic material including a fluorescent or phosphorous material that emits red, green, blue, and white light. The organic emission layer may include a low-molecular weight organic material or a polymer organic material, and a functional layer, such as a hole transport layer (HTL), a hole injection layer (HIL), an electron transport layer (ETL), or an electron injection layer (EIL), may be selectively disposed under or below and on the organic emission layer.

The intermediate layer 220 may be arranged to correspond to each of pixel electrodes 210. However, the disclosure is not limited thereto. The intermediate layer 220 may include a layer as a single body across the pixel electrodes 210, and various modifications may be made.

The opposite electrode 230 may be a light-transmitting electrode or a reflective electrode. In an embodiment, the opposite electrode 230 may be a transparent or semi-transparent electrode, and may be provided as a metal thin-film having a low work function, the metal thin-film comprising lithium (Li), calcium (Ca), LiF/Ca, LiF/Al, Al, Ag, Mg, and a compound thereof. A transparent conductive oxide (TCO) film including ITO, IZO, ZnO, or $In_2O_3$ may be further disposed on the metal thin-film. The opposite electrode 230 may be arranged across the display region and disposed on the intermediate layer 220 and the pixel-defining layer 125. The opposite electrode 230 may be a single body with respect to first display elements DE1 and may correspond to the pixel electrodes 210.

The first display element DE1 may be covered with an encapsulation layer (not shown). The encapsulation layer may include at least one organic encapsulation layer and at least one inorganic encapsulation layer. The at least one inorganic encapsulation layer may include one or more inorganic materials from among $Al_2O_3$, $TiO_2$, $Ta_2O_5$, $HfO_2$, ZnO, $SiO_2$, $SiN_x$, and SiON. The at least one inorganic encapsulation layer may include a layer or layers including the material described above. The at least one organic encapsulation layer may include a polymer-based material. The polymer-based material may include an acryl-based resin, such as PMMA and polyacrylic acid, an epoxy-based resin, polyimide, and polyethylene. In an embodiment, the at least one organic encapsulation layer may include acrylate polymer.

Figure 15A:
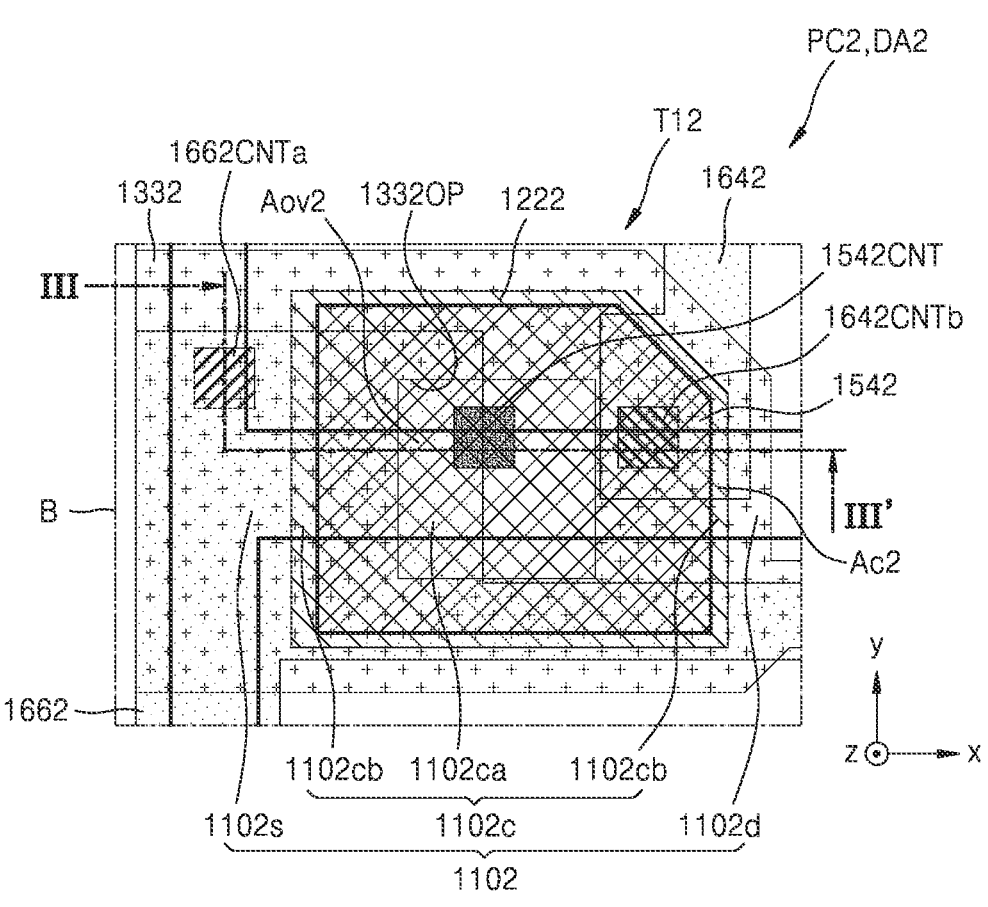
FIG. 15A is an enlarged schematic plan view illustrating region B in FIG. 7 as an example.
Figure 15B:
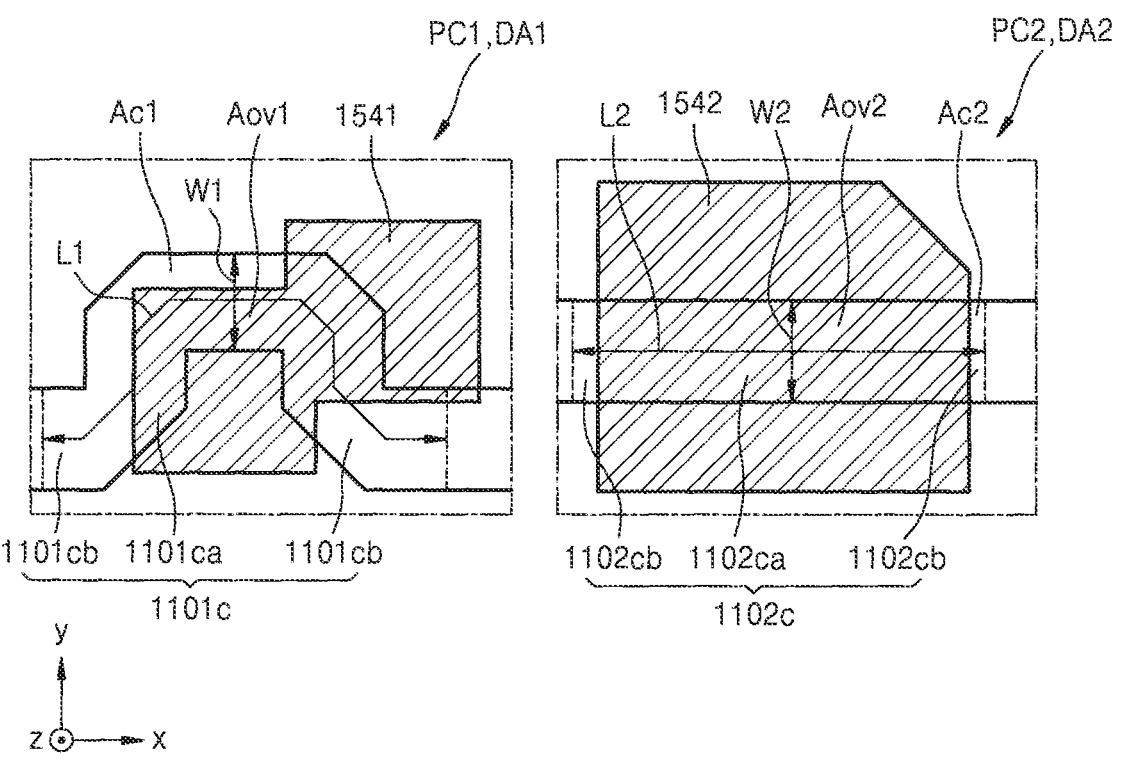
FIG. 15B is a diagram for comparison between a member of FIG. 13 and a member of FIG. 15A.

FIG. 15A is an enlarged schematic plan view illustrating region B in FIG. 7 as an example, and FIG. 15B is a diagram for comparison between a member of FIG. 13 and an element of FIG. 15A. In detail, FIG. 15A is an enlarged schematic plan view illustrating, as an example, a portion of the second pixel circuit PC2 which is arranged in the second display region DA2 and corresponds to region B in FIG. 7.

Referring to FIG. 15A, the second pixel circuit PC2 may include a second semiconductor layer 1102, a second gate electrode 1222, a second electrode 1542, a second connection electrode 1642, a fourth electrode 1332, and a second conductive pattern 1662. The second semiconductor layer 1102 may correspond to the first semiconductor pattern 1100 in FIG. 8, the second gate electrode 1222 may correspond to the first gate pattern 1220 in FIG. 8, the second electrode 1542 may correspond to the first connection pattern 1540 in FIG. 10, the second connection electrode 1642 may correspond to the third connection pattern 1640 in FIG. 11, the fourth electrode 1332 may correspond to the storage electrode 1330 in FIG. 9, and the second conductive pattern 1662 may correspond to the ninth conductive line 1660 in FIG. 11.

The second semiconductor layer 1102 may include a silicon semiconductor. For example, the second semiconductor layer 1102 may include amorphous silicon or polysilicon. The second semiconductor layer 1102 may include a second source region 1102s, a second drain region 1102d, and a second channel region 1102c, the second channel region 1102c being between the second source region 1102s and the second drain region 1102d. The second source region 1102s and the second drain region 1102d may be regions doped by adding dopants. A portion of the second semiconductor layer 1102 may have an "I" shape. The second channel region 1102c of the second semiconductor layer 1102 may have an "I" shape.

In case that the first pixel circuit PC1 and the second pixel circuit PC2 are compared with reference to FIG. 15B, the first channel region 1101c and the second channel region 1102c may differ in shape from each other.

In an embodiment, a ratio (W2/L2) of a width W2 of the second channel region 1102c to a length L2 of the second channel region 1102c may be greater than a ratio (W1/L1) of a width W1 of the first channel region 1101c to a length L1 of the first channel region 1101c.

Referring to FIG. 15A again, the second gate electrode 1222 may be disposed (or located) on the second semiconductor layer 1102 and overlap the second channel region 1102c. The second gate electrode 1222 may include Mo, Al, Cu, Ti, within the spirit and the scope of the disclosure, and may include a layer or layers. For example, the second gate electrode 1222 may include a single Mo layer.

The second electrode 1542 may be disposed (or located) on the second gate electrode 1222 and connected to the second gate electrode 1222. The second gate electrode 1222 may be connected to the second gate electrode 1222 via a fourth contact hole 1542CNT. The fourth contact hole 1542CNT may pass through an opening 13320P defined in the fourth electrode 1332 to be described later. The second electrode 1542 may include Mo, Al, Cu, Ti, within the spirit and the scope of the disclosure, and may include a layer or layers. For example, the second electrode 1542 may include layers of a Mo layer and a Ti layer.

In an embodiment, at least a portion of the second electrode 1542 may overlap the second channel region 1102c of the second semiconductor layer 1102. The second channel region 1102c may include a second overlapping area 1102ca overlapping the second electrode 1542 and a second non-overlapping area 1102cb not overlapping the second electrode 1542.

In case that the first pixel circuit PC1 and the second pixel circuit PC2 are compared with reference to FIG. 15B, a ratio (Aov1/Ac1) of a first overlapping area Aov1 of the first overlapping region 1101ca of the first channel region 1101c overlapping the first electrode 1541 to a first channel area Ac1 of the first channel region 1101c may be less than a ratio (Aov2/Ac2) of a second overlapping area Aov2 of the second overlapping region 1102ca of the second channel region 1102c overlapping the second electrode 1542 to a second channel area Ac2 of the second channel region 1102c.

The first electrode 1541 and the second electrode 1542 may prevent hydrogen emitted from a semiconductor layer or insulating layer within the display panel from escaping to the outside of the display panel. For example, in case that sizes (or areas) of the first electrode 1541 and the second electrode 1542 increase, an amount of hydrogen escaping to the outside (for example, dehydrogenation) of the display panel may decrease. Because the first electrode 1541 and the second electrode 1542 overlap a channel region of the semiconductor layer, an amount of dehydrogenation around the channel region may vary according to an overlapping area of the first electrode 1541 and the second electrode 1542 with the second electrode 1542. An amount of hydrogen remaining (or distributed) around the channel region may vary according to the overlapping area of the first electrode 1541 and the second electrode 1542 with the channel region. In case that the amount of hydrogen remaining around the channel region increases, an amount of hydrogen included in the channel region may increase. For example, because the ratio (Aov2/Ac2) of the second overlapping area Aov2 of the second overlapping region $1102ca$ of the second channel region $1102c$ overlapping the second electrode $1542$ to the second channel area Ac2 is greater than the ratio (Aov1/Ac1) of the first overlapping area Aov1 of the first overlapping region $1101ca$ of the first channel region $1101c$ overlapping the first electrode $1541$ to the first channel region Ac1, the amount of dehydrogenation around the second channel region $1102c$ may be less than the amount of dehydrogenation around the first channel region $1101c$. In other words, the amount of hydrogen remaining around the second channel region $1102c$ may be greater than the amount of hydrogen remaining around the first channel region $1101c$. The amount of hydrogen included in the second channel region $1102c$ may be greater than the amount of hydrogen included in the first channel region $1101c$.

Mobility of the channel region may vary according to the amount of hydrogen included in the channel region. A magnitude of a current flowing in the channel region may vary. For example, because the amount of hydrogen included in the second channel region $1102c$ is greater than the amount of hydrogen included in the first channel region $1101c$, the mobility of the second channel region $1102c$ may be greater than the mobility of the first channel region $1101c$.

As described above, in a case in which the mobility of the second channel region $1102c$ is greater than the mobility of the first channel region $1101c$, even in case that the second pixel circuit PC2 simultaneously drives second display elements DE2 (see FIG. 3), unlike the first pixel circuit PC1, the second display elements DE2 driven by one second pixel circuit PC2 may be controlled to emit light with substantially the same luminance as a luminance with which one first display element DE1 (see FIG. 3) driven by one first pixel circuit PC1 emits light. Because the first display element DE1 and the second display element DE2 may be controlled to emit light with substantially the same luminance as each other, the luminance of the first display region DA1 and the luminance of the second display region DA2 are substantially the same as each other, and thus, a boundary between the first display region DA1 and the second display region DA2 may be prevented from being visible.

Referring back to FIG. 15A, the second connection electrode $1642$ may be disposed on the second electrode $1542$. Because the second connection electrode $1642$ corresponds to the third connection pattern $1640$ in FIG. 11, the second connection electrode $1642$ may substantially extend in the first direction (for example, the ±x direction). A portion of the second connection electrode $1642$ may overlap the second electrode $1542$, and the other portion of the second connection electrode $1642$ may overlap a fourth semiconductor layer $1402$ shown in FIG. 16 to be described later. The second connection electrode $1642$ may connect the second electrode $1542$ and the fourth semiconductor layer $1402$ to each other, as described later with reference to FIG. 16. The second connection electrode $1642$ may be connected to the fourth semiconductor layer $1402$ via a $6^{th}$-$1^{st}$ contact hole $1642CNTa$, and may be connected to the second electrode $1542$ via a $6^{th}$-$2^{nd}$ contact hole $1642CNTb$. The fourth semiconductor layer $1402$ may include a different material from a material of the second semiconductor layer $1102$. For example, the fourth semiconductor layer $1402$ may include an oxide semiconductor material. The second connection electrode $1642$ may include Mo, Al, Cu, Ti, within the spirit and the scope of the disclosure, and may include a layer or layers. For example, the second connection electrode $1642$ may include layers of a Ti layer, an Al layer, and another Ti layer.

The fourth electrode $1332$ may be between the second gate electrode $1222$ and the second electrode $1542$. The fourth electrode $1332$ may have the opening $13320P$ that exposes a portion of an insulating layer located between the second gate electrode $1222$ and the fourth electrode $1332$. The fourth electrode $1332$ may include Mo, Al, Cu, Ti, within the spirit and the scope of the disclosure, and may include a layer or layers. For example, the fourth electrode $1332$ may include a single Mo layer.

The second conductive pattern $1662$ may be disposed on the second electrode $1542$. The first driving voltage ELVDD (see FIG. 6) may be applied to the second conductive pattern $1662$. The second conductive pattern $1662$ may be connected to the fourth electrode $1332$ via a second contact hole $1662CNTa$. The second conductive pattern $1662$ may include Mo, Al, Cu, Ti, within the spirit and the scope of the disclosure, and may include a layer or layers. For example, the second conductive pattern $1662$ may include layers of a Ti layer, an Al layer, and another Ti layer.

The second pixel circuit PC2 may include a second driving transistor T12 having a portion of the second semiconductor layer $1102$ and the second gate electrode $1222$. The second driving transistor T12 may output the second driving current to the second display elements DE2 electrically connected to the second pixel circuit PC2.

Referring to FIG. 13 together with FIG. 15A, the first driving transistor T11 of the first pixel circuit PC1 may output the first driving current to the first display element DE1 electrically connected to the first pixel circuit PC1.

In an embodiment, a magnitude of the first driving current for the first display element DE1 to emit light with a first grayscale may be less than a magnitude of the second driving current for the second display elements DE2 to all emit light with the first grayscale. This may be a result of the difference in the amount of hydrogen remaining in the channel region of the first electrode $1541$ and the second electrode $1542$ described above.

In an embodiment, the second driving current may be substantially equally distributed to the second display elements DE2, and the magnitude of the current flowing in each of the second display elements DE2 may be substantially equal to the magnitude of the first driving current.

In an embodiment, the number of the second display elements DE2 may be n, and the magnitude of the second driving current may be about n times that of the first driving current. Here, n is a natural number.

Even in case that the second pixel circuit PC2 simultaneously drives the second display elements DE2, unlike the first pixel circuit PC1, the luminance of the first display region DA1 and the luminance of the second display region DA2 are substantially equal to each other, and thus, the boundary between the first display region DA1 and the second display region DA2 may be prevented from being visible.

Figure 16:
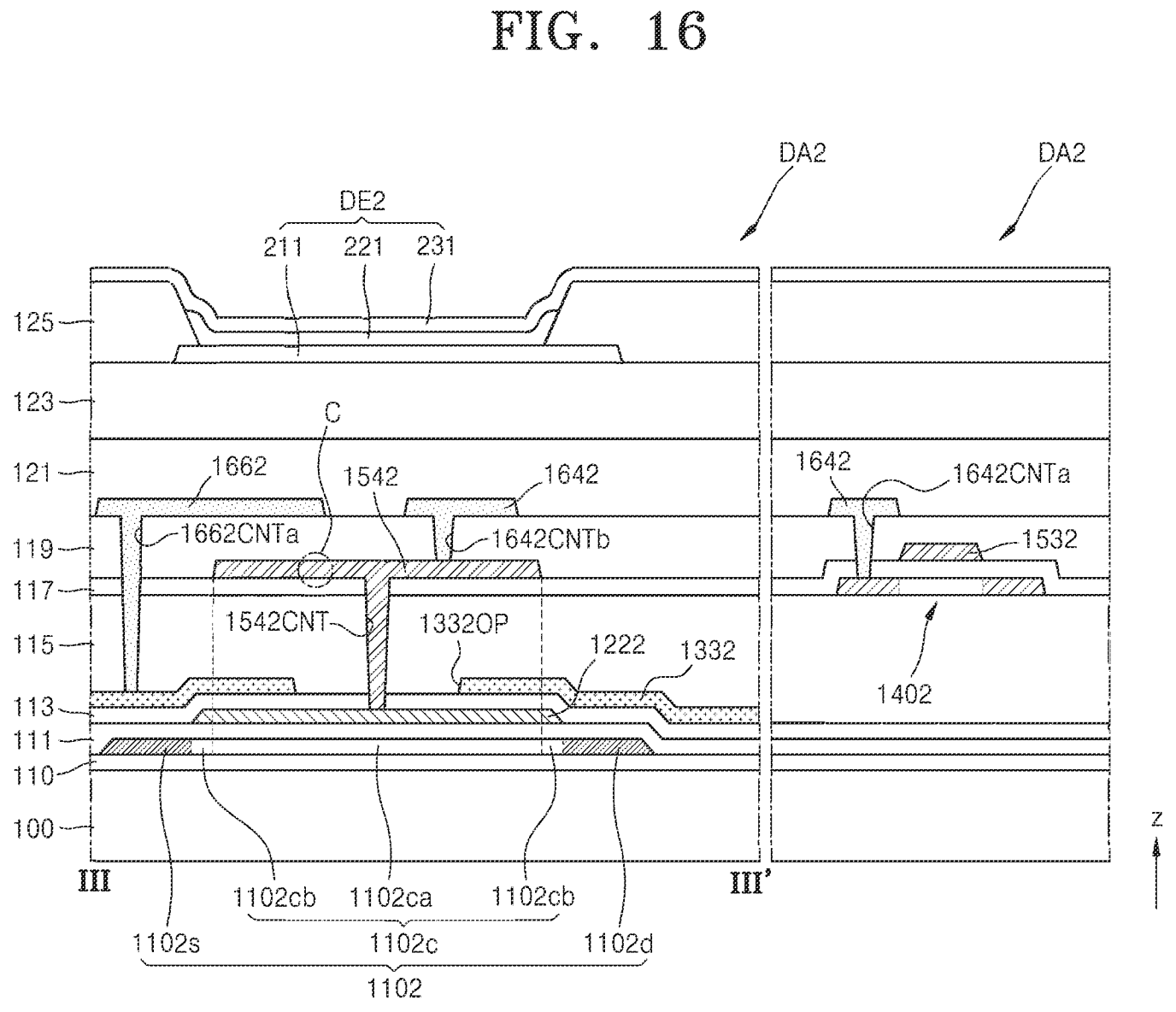

FIG. 16 is a schematic cross-sectional view of a portion of FIG. 15A, taken along line in FIG. 15A, as an example. In FIG. 16, the same reference symbols as those of FIG. 14 denote the same members, and redundant descriptions thereof are omitted.

Referring to FIG. 16, the second electrode $1542$ may be connected to the second gate electrode $1222$ via the fourth contact hole $1542CNT$, which is defined in the second insulating layer $113$, the third insulating layer $115$, and the fourth insulating layer 117. The fourth contact hole 1542CNT may pass through the opening 13320P defined in the fourth electrode 1332.

In an embodiment, at least a portion of the second electrode 1542 may overlap the second channel region 1102c of the second semiconductor layer 1102. The second channel region 1102c may include the second overlapping region 1102ca overlapping the second electrode 1542 and the second non-overlapping region 1102cb not overlapping the second electrode 1542.

In an embodiment, referring to FIG. 16 together with FIG. 14, a ratio of an overlapping area of the second overlapping region 1102ca of the second channel region 1102c overlapping the second electrode 1542 to a channel region of the second channel region 1102c may be greater than a ratio of an overlapping area of the first overlapping region 1101ca of the first channel region 1101c overlapping the first electrode 1541 to a channel area of the first channel region 1101c.

The fourth semiconductor layer 1402 may include an oxide semiconductor material. The fourth semiconductor layer 1402 may include an oxide of at least one material selected from the group consisting of In, Ga, Sn, Zr, V, Hf, Cd, Ge, Cr, Ti, Al, Cs, Ce, and Zn.

For example, the fourth semiconductor layer 1402 may include an ITZO semiconductor layer, an IGZO semiconductor layer, within the spirit and the scope of the disclosure. Because the oxide semiconductor has a large band gap (about 3.1 eV), high carrier mobility, and low leakage current, a voltage drop is not large even in case that a driving time is long, and thus, a change of luminance due to the voltage drop is not large, even in case that the display apparatus is driven at low frequencies.

The fourth semiconductor layer 1402 may include a channel region, a source region, and a drain region, the source region and the drain region being arranged at opposite sides of the channel region, respectively. The fourth semiconductor layer 1402 may include a layer or layers.

A second gate line 1532 may at least partially overlap the fourth semiconductor layer 1402. The second gate line 1532 may overlap the channel region of the fourth semiconductor layer 1402. The second gate line 1532 may correspond to the seventh conductive line 1530 in FIG. 10.

The second connection electrode 1642 may be connected to the fourth semiconductor layer 1402 via the $6^{th}$-$1^{st}$ contact hole 1642CNTa defined in the fourth insulating layer 117 and the fifth insulating layer 119. The second connection electrode 1642 may be connected to the second electrode 1542 via the $6^{th}$-$2^{nd}$ contact hole 1642CNTb defined in the fifth insulating layer 119. The second connection electrode 1642 may connect the fourth semiconductor layer 1402 and the second electrode 1542 to each other.

The second conductive pattern 1662 may be connected to the fourth electrode 1332 via the second contact hole 1662CNTa, which is defined in the third insulating layer 115, the fourth insulating layer 117, and the fifth insulating layer 119.

The second display element DE2, which is electrically connected to the second pixel circuit PC2 (see FIG. 15A), may be disposed on the second planarization layer 123. The second display element DE2 may include a pixel electrode 211, an intermediate layer 221, and an opposite electrode 231, the intermediate layer 221 including an organic emission layer. The pixel electrode 211 may correspond to the pixel electrode 210 in FIG. 14, the intermediate layer 221 may correspond to the intermediate layer 220 in FIG. 14, and the opposite electrode 231 may correspond to the opposite electrode 230 in FIG. 14.

Figure 17:
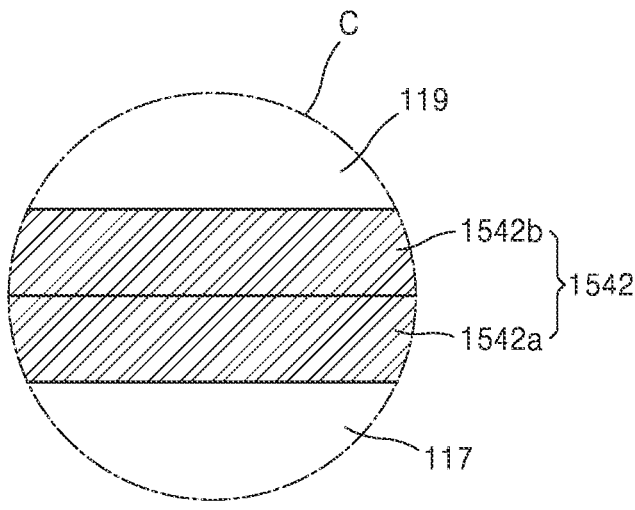
FIG. 17 is an enlarged schematic plan view illustrating region C in FIG. 16 as an example.

FIG. 17 is an enlarged schematic plan view illustrating region C in FIG. 16 as an example.

Referring to FIG. 17, the second electrode 1542 may include a first layer 1542a and a second layer 1542b, the second layer 1542b being on the first layer 1542a. The first layer 1542a may include Ti. The second layer 1542b may include Mo.

Although the second electrode 1542 is described, the embodiment is also equally applicable to the first electrode 1541 in FIG. 4, which is disposed on a same layer as a layer on which the second electrode 1542 is disposed.

Figure 18:
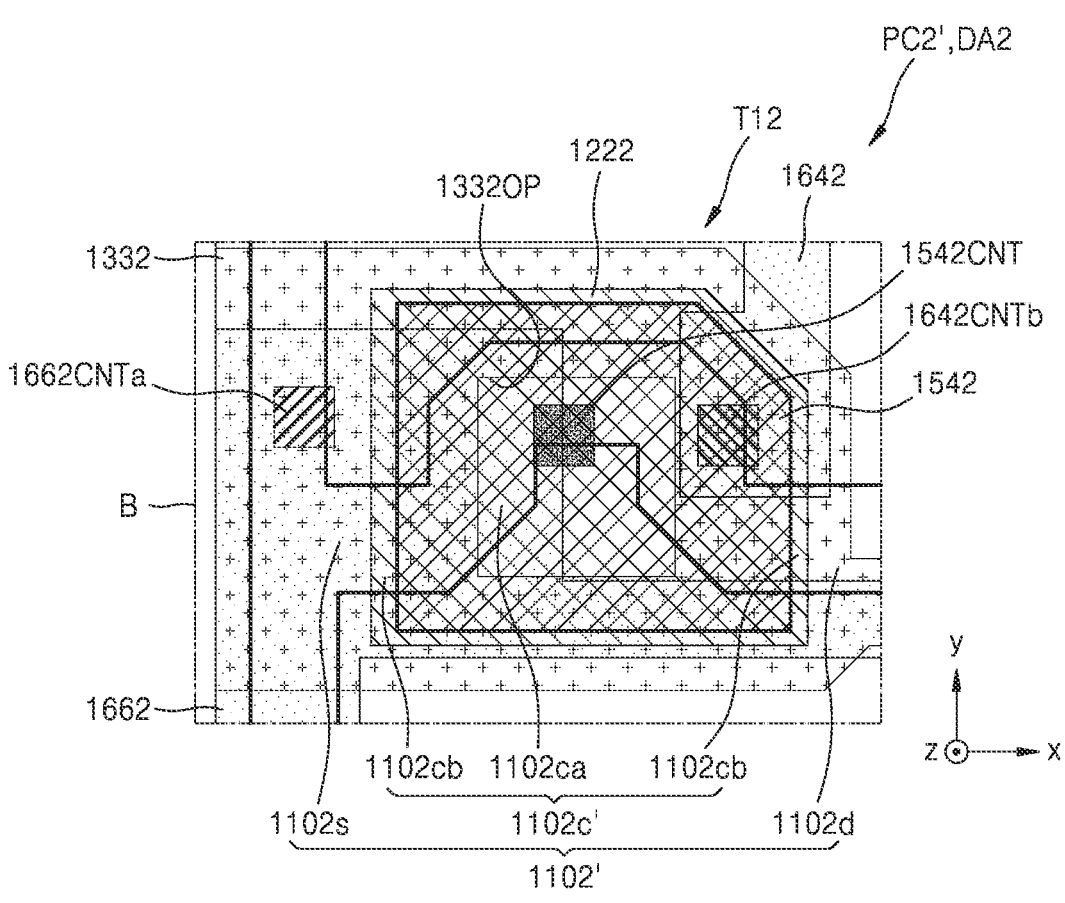
FIG. 18 is an enlarged schematic plan view illustrating region B in FIG. 7 as an example.

FIG. 18 is an enlarged schematic plan view illustrating region B in FIG. 7 as an example. FIG. 18 is a modification of FIG. 15A, differing in a structure of a second semiconductor layer. Hereinafter, descriptions of FIG. 18 overlapping those of FIG. 15A are omitted, and differences are described.

Referring to FIG. 18, a second pixel circuit PC2' may include a second semiconductor layer 1102'. A portion of the second semiconductor layer 1102' may have an omega (1) shape, unlike the second semiconductor layer 1102 shown in FIG. 15A. A second channel region 1102c' of the second semiconductor layer 1102' may have an omega (1) shape.

In case that the first pixel circuit PC1 and the second pixel circuit PC2' are compared with each other with reference to FIG. 13, the first channel region 1101c and the second channel region 1102c' may have substantially the same shape as each other. For example, a ratio (W/L) of a width of the second channel region 1102c' to a length of the second channel region 1102c' may be substantially equal to a ratio (W/L) of the width of the first channel region 1101c to the length of the first channel region 1101c.

Figure 19:
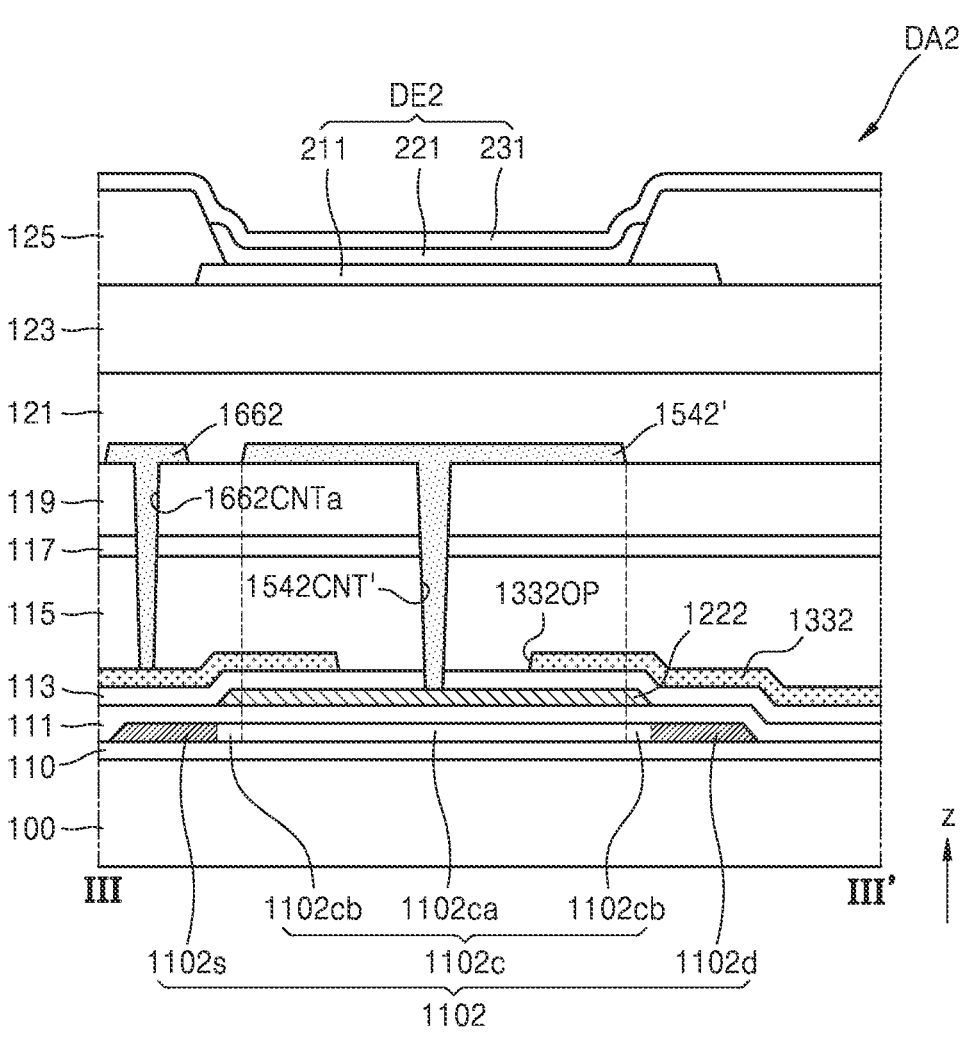
FIG. 19 is a schematic cross-sectional view of a portion of FIG. 15A, taken along line in FIG. 15A, as an example.

FIG. 19 is a schematic cross-sectional view of a portion of FIG. 15A, taken along line in FIG. 15A, as an example. FIG. 19 is a modification of FIG. 16, differing in a structure of a second electrode. Hereinafter, descriptions of FIG. 19 overlapping those of FIG. 16 are omitted, and differences are described.

Referring to FIG. 19, a second electrode 1542' may be disposed on the fifth insulating layer 119. The second electrode 1542' may be disposed on a same layer as a layer on which the second connection electrode 1642 of FIG. 16 is disposed. The second electrode 1542' and the second connection electrode 1642 may be a single body. Accordingly, the $6^{th}$-$2^{nd}$ contact hole 1642CNTb of FIG. 16, which connects the second electrode 1542' and the second connection electrode 1642 to each other, may be omitted.

The second electrode 1542' may be connected to the second gate electrode 1222 via a fourth contact hole 1542CNT', which is defined in the second insulating layer 113, the third insulating layer 115, the fourth insulating layer 117, and the fifth insulating layer 119. The fourth contact hole 1542CNT' may pass through the opening 13320P defined in the fourth electrode 1332.

The second electrode 1542' may include layers of a Ti layer, an Al layer, and another Ti layer.

In FIG. 19, the second electrode 1542' is disposed on the fifth insulating layer 119. However, in an embodiment, the second electrode 1542' may also be disposed on the first planarization layer 121.

Figure 20:
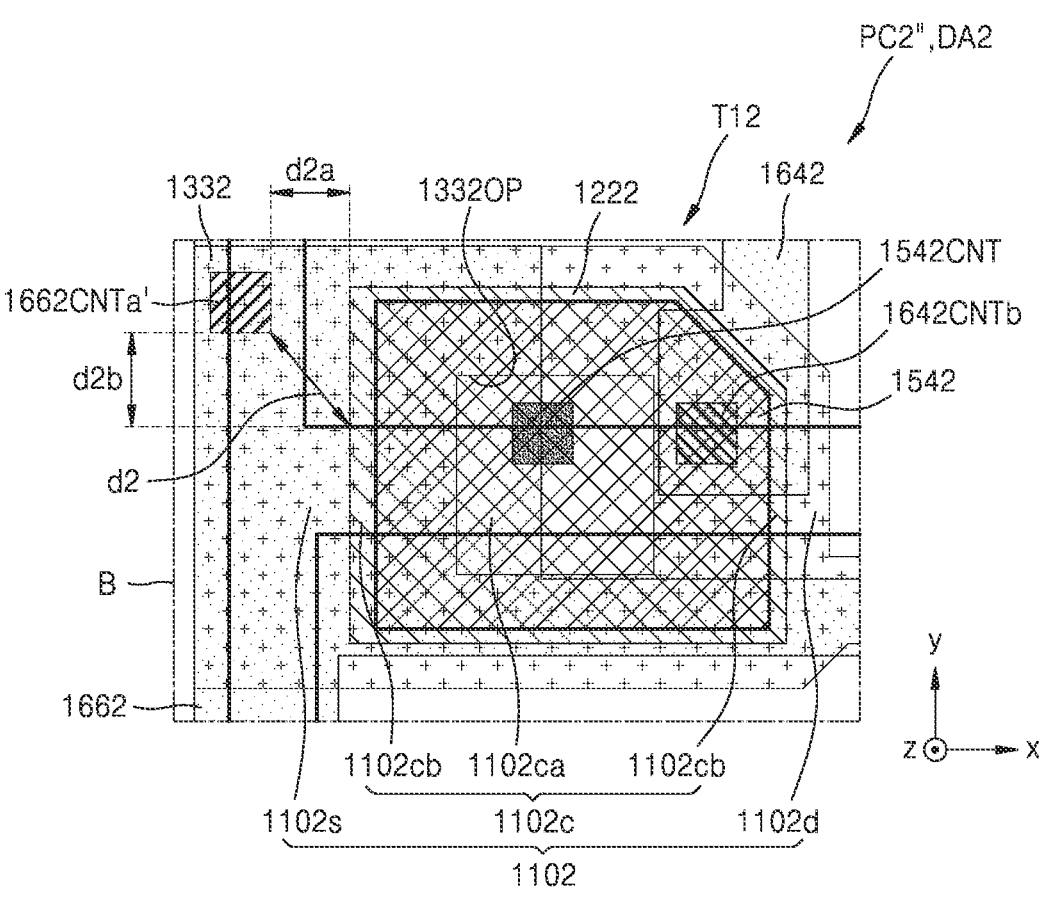
FIG. 20 is an enlarged schematic plan view illustrating region B in FIG. 7 as an example.

FIG. 20 is an enlarged schematic plan view illustrating region B in FIG. 7 as an example. FIG. 20 is a modification of FIG. 15A, differing in a structure of a second contact hole. Hereinafter, descriptions of FIG. 20 overlapping those of FIG. 15A are omitted, and differences are described.

Referring to FIG. 20 together with FIG. 13, a first distance d1 between the first contact hole 1661CNTa and the first channel region $1101c$ of the first pixel circuit PC1 may be less than a second distance d2 between a second contact hole 1662CNTa' and a second channel region $1102c$ of a second pixel circuit PC2".

For example, a $1^{st}$-$1^{st}$ distance d1$a$ between the first contact hole 1661CNTa and the first channel region $1101c$ in the first direction (for example, the ±x direction) may be less than a $2^{nd}$-$1^{st}$ distance d2$a$ between the second contact hole 1662CNTa' and the second channel region $1102c$ in the first direction (for example, the ±x direction). By way of example, a $1^{st}$-$2^{nd}$ distance d1$b$ between the first contact hole 1661CNTa and the first channel region $1101c$ in the second direction (for example, the ±y direction) may be less than a $2^{nd}$-$2^{nd}$ distance d2$b$ between the second contact hole 1662CNTa' and the second channel region $1102c$ in the second direction (for example, the ±y direction).

A dehydrogenation process may be performed through the first contact hole 1661CNTa and the second contact hole 1662CNTa', and an amount of dehydrogenation may vary according to a degree to which the first contact hole 1661CNTa and the second contact hole 1662CNTa' are apart from a channel region. For example, the amount of dehydrogenation through the first contact hole 1661CNTa apart from the first channel region $1101c$ by the first distance d1 may be greater than the amount of dehydrogenation through the second contact hole 1662CNTa' apart from the second channel region $1102c$ by the second distance d2. According to an opposite interpretation, an amount of hydrogen included in the second channel region $1102c$ may be greater than an amount of hydrogen included in the first channel region $1101c$.

Figure 21:
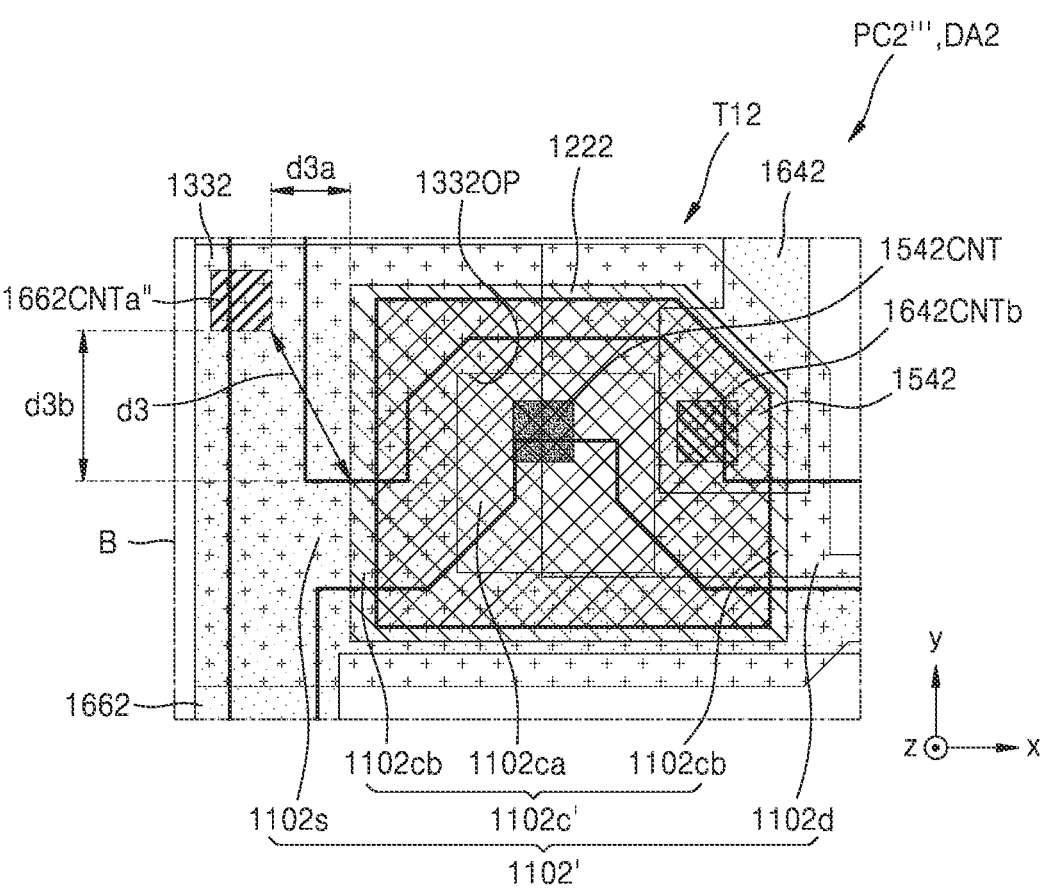
FIG. 21 is an enlarged schematic plan view illustrating region B in FIG. 7 as an example.

FIG. 21 is an enlarged schematic plan view illustrating region B in FIG. 7 as an example. FIG. 21 is a modification of FIG. 18, differing in a structure of a second contact hole. Hereinafter, descriptions of FIG. 21 overlapping those of FIG. 18 are omitted, and differences are described.

Referring to FIG. 21 together with FIG. 13, the first distance d1 between the first contact hole 1661CNTa and the first channel region $1101c$ of the first pixel circuit PC1 may be less than a third distance d3 between a second contact hole 1662CNTa" and a second channel region $1102c'$ of a second pixel circuit PC2"'.

For example, the $1^{st}$-$1^{st}$ distance d1$a$ between the first contact hole 1661CNTa and the first channel region $1101c$ in the first direction (for example, the ±x direction) may be less than a $3^{rd}$-$1^{st}$ distance d3$a$ between the second contact hole 1662CNTa" and the second channel region $1102c'$ in the first direction (for example, the ±x direction). By way of example, the $1^{st}$-$2^{nd}$ distance d1$b$ between the first contact hole 1661CNTa and the first channel region $1101c$ in the second direction (for example, the ±y direction) may be less than a $3^{rd}$-$2^{nd}$ distance d3$b$ between the second contact hole 1662CNTa" and the second channel region $1102c'$ in the second direction (for example, the ±y direction).

A dehydrogenation process may be performed through the first contact hole 1661CNTa and the second contact hole 1662CNTa", and an amount of dehydrogenation may vary according to a degree to which the first contact hole 1661CNTa and the second contact hole 1662CNTa" are apart from a channel region. For example, the amount of dehydrogenation through the first contact hole 1661CNTa apart from the first channel region $1101c$ by the first distance d1 may be greater than the amount of dehydrogenation through the second contact hole 1662CNTa" apart from the second channel region $1102c'$ by the third distance d3. According to an opposite interpretation, an amount of hydrogen included in the second channel region $1102c'$ may be greater than an amount of hydrogen included in the first channel region $1101c$.

Figure 22:
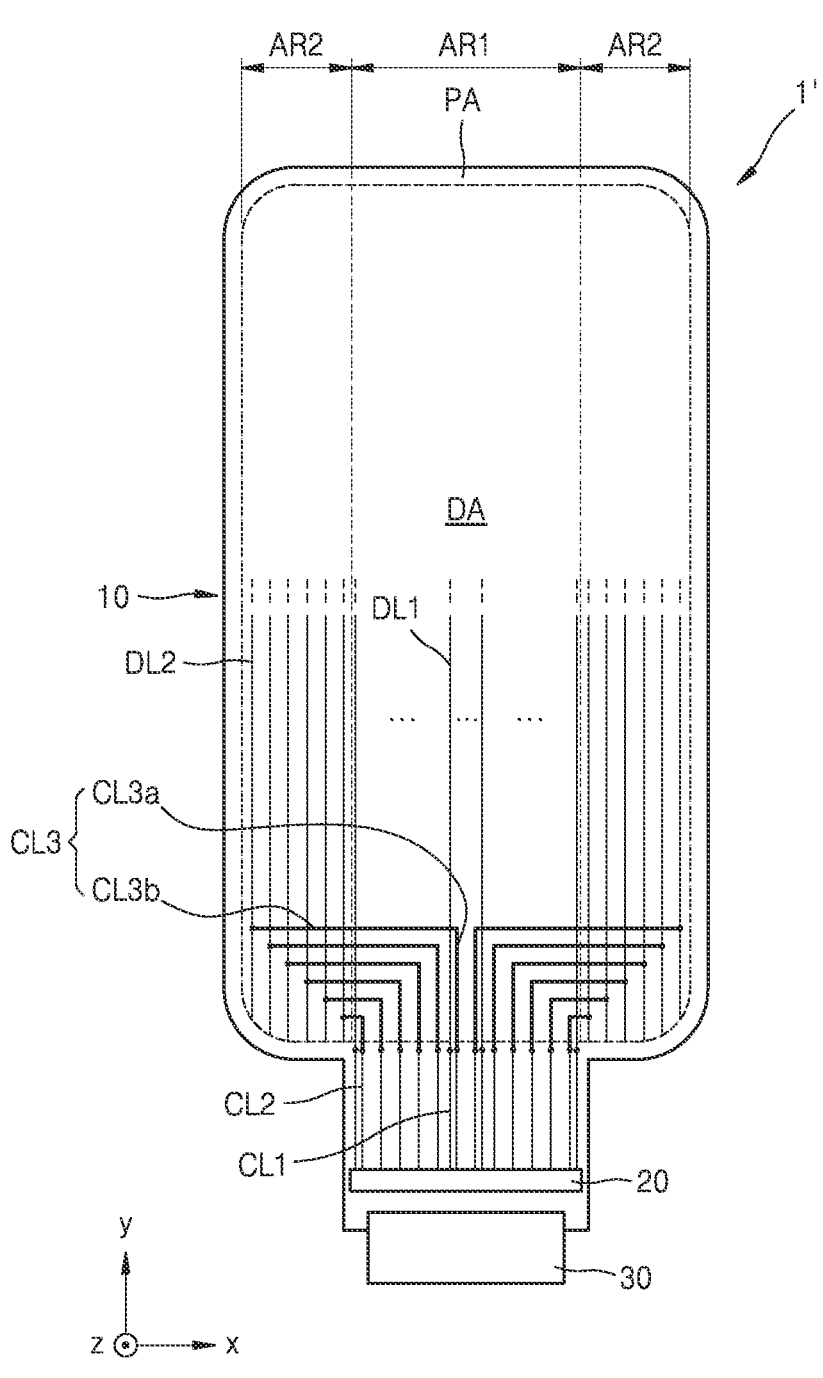
FIG. 22 is a schematic plan view schematically illustrating a display apparatus according to an embodiment.

FIG. 22 is a schematic plan view schematically illustrating a display apparatus 1' according to an embodiment. In FIG. 22, the same reference symbols as those of FIG. 1 denote the same members, and redundant descriptions thereof are omitted.

Referring to FIG. 22, the display apparatus may include data lines each extending in the second direction (for example, the ±y direction) in the display region DA. Data lines arranged in a first region AR1 of the display region DA from among the data lines may be referred to as first data lines DL1, and data lines arranged in a second region AR2 of the display region DA from among the data lines may be referred to as second data lines DL2. The second regions AR2 of the display region DA may be respectively located at opposite sides of the first region AR1 of the display region DA in the first direction (for example, the ±x direction).

The first data line DL1 may be connected to the data pad unit 20 via a first connection line CL1. The first connection line CL1 may transmit a data signal received from the data pad unit 20 to the first data line DL1.

The second data lines DL2 may be connected to the data pad unit 20 via a second connection line CL2 and a third connection line CL3. The second connection line CL2 may connect the third connection line CL3 and the data pad unit 20 to each other, and the third connection line CL3 may connect the second data line DL2 and the second connection line CL2 to each other. The second connection line CL2 and the third connection line CL3 may transmit a data signal received from the data pad unit 20 to the second data line DL2.

The third connection line CL3 may be arranged in the display region DA. The third connection line CL3 may include a first portion CL3$a$ extending in the second direction (for example, the ±y direction) and a second portion CL3$b$ extending in the first direction (for example, the ±x direction). The third connection line CL3 connecting the second connection line CL2 and the data pad unit 20 to each other is arranged in the display region DA, not the peripheral region PA, and thus, an area of the peripheral region PA may be reduced. In other words, a dead space in which no image is displayed may be reduced, and an area of the display region DA may relatively increase.

Figure 23:
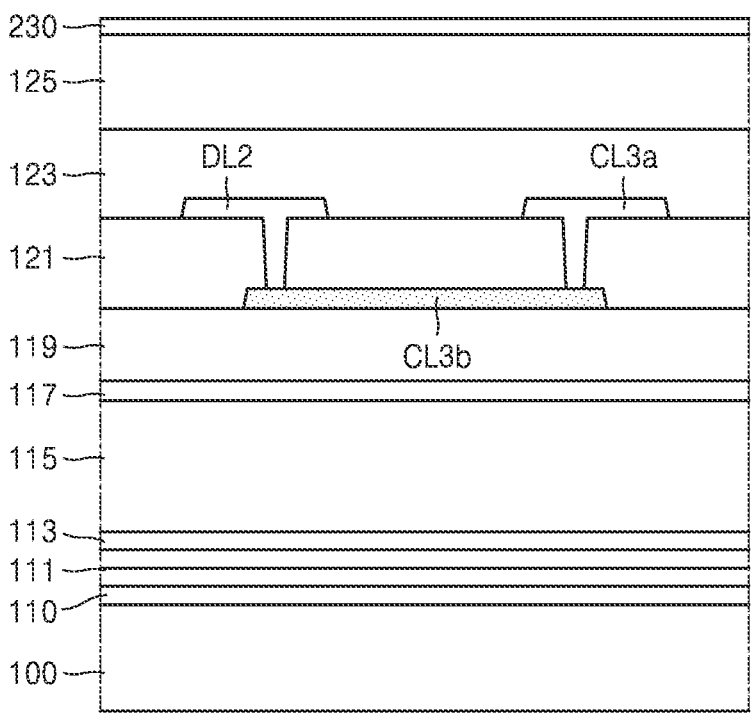
FIG. 23 is a schematic cross-sectional view schematically illustrating a display apparatus according to an embodiment.

FIG. 23 is a schematic cross-sectional view schematically illustrating a display apparatus according to an embodiment. In detail, FIG. 23 is a schematic cross-sectional view schematically illustrating the third connection line and second data line in FIG. 22. In FIG. 23, the same reference symbols as those of FIG. 14 denote the same members, and redundant descriptions thereof are omitted.

Referring to FIG. 23, the second portion CL3$b$ of the third connection line CL3 may be disposed on the fifth insulating layer 119, and the second data line DL2 and the first portion CL3$a$ of the third connection line CL3 may be disposed on the first planarization layer 121. The second portion CL3$b$ of the third connection line CL3 may be disposed on a same layer as a layer on which the first connection electrode 1641 of FIG. 14 and the second connection electrode 1642 of FIG. 16 are disposed.

The second portion CL3$b$ of the third connection line CL3 may connect the second data line DL2 and the first portion CL3$a$ of the third connection line CL3 to each other. The second portion CL3$b$ of the third connection line CL3 may be connected to the second data line DL2 and the first portion CL3*a* of the third connection line CL3 via contact holes defined in the first planarization layer 121.

The first portion CL3*a* of the third connection line CL3 may correspond to the thirteenth conductive line 1720 in FIG. 12. The first portion CL3*a* of the third connection line CL3 may be implemented as the thirteenth conductive line 1720. The second portion CL3*b* of the third connection line CL3 may correspond to the tenth conductive line 1610 in FIG. 11. The second portion CL3*b* of the third connection line CL3 may be implemented as the tenth conductive line 1610.

Although a display apparatus is described above, the disclosure is not limited thereto. For example, it may be understood that methods of manufacturing the display apparatus also fall within the scope of the disclosure.

According to an embodiment, a display apparatus with an extended display area may be implemented. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope and as defined by the following claims.

What is claimed is:

1. A display apparatus comprising:
a substrate comprising a first display region and a second display region of a display region;
a first pixel circuit disposed in the first display region and comprising:
  a first semiconductor layer;
  a first gate electrode; and
  a first electrode, wherein
the first semiconductor layer comprises a first channel region, the first gate electrode overlaps the first channel region in a plan view, and the first electrode overlaps the first gate electrode in the plan view and is connected to the first gate electrode through a first contact hole formed in insulating layers interposed between the first electrode and the first gate electrode; and
a second pixel circuit disposed in the second display region and comprising:
  a second semiconductor layer;
  a second gate electrode; and
  a second electrode, wherein
the second semiconductor layer comprises a second channel region, the second gate electrode overlaps the second channel region in the plan view, and the second electrode overlaps the second gate electrode in the plan view and is connected to the second gate electrode through a second contact hole formed in the insulating layers interposed between the second electrode and the second gate electrode,
wherein a ratio of a first overlapping area of a first overlapping region of the first channel region overlapping the first electrode to a first channel area of the first channel region in the plan view is less than a ratio of a second overlapping area of a second overlapping region of the second channel region overlapping the second electrode to a second channel area of the second channel region in the plan view, and a ratio of a width of the second channel region to a length of the second channel region is greater than or equal to a ratio of a width of the first channel region to a length of the first channel region.

2. The display apparatus of claim 1, further comprising:
a gate driving circuit disposed in the second display region and transmits a gate signal to the first pixel circuit and the second pixel circuit, and
second display elements at least partially overlap the gate driving circuit in the plan view.

3. The display apparatus of claim 1, wherein
at least a portion of the first electrode overlaps the first channel region in the plan view.

4. The display apparatus of claim 1, wherein
a mobility of the second channel region is greater than a mobility of the first channel region.

5. The display apparatus of claim 1, wherein
an amount of hydrogen included in the second channel region is greater than an amount of hydrogen included in the first channel region.

6. The display apparatus of claim 1, wherein
each of the first electrode and the second electrode has a first layer and a second layer, the second layer being disposed on the first layer.

7. The display apparatus of claim 1, wherein
the first pixel circuit comprises:
  a third semiconductor layer; and
  a first connection electrode, the third semiconductor layer and the first semiconductor layer comprising a different material, and the first connection electrode electrically connecting the first electrode to the third semiconductor layer, and
the second pixel circuit comprises:
  a fourth semiconductor layer; and
  a second connection electrode, the fourth semiconductor layer and the second semiconductor layer comprising a different material, and the second connection electrode electrically connecting the second electrode to the fourth semiconductor layer.

8. The display apparatus of claim 7, wherein
each of the first semiconductor layer and the second semiconductor layer comprises a silicon semiconductor material, and
each of the third semiconductor layer and the fourth semiconductor layer comprises an oxide semiconductor material.

9. The display apparatus of claim 8, further comprising:
a data line disposed in the display region and extending in a first direction;
a data pad unit disposed outside of the display region; and
a connection line that transmits a data signal received from the data pad unit to the data line, and having a first portion and a second portion, the first portion extending in the first direction, and the second portion extending in a second direction and electrically connecting the first portion to the data line, wherein
the second portion of the connection line, the first connection electrode, and the second connection electrode are disposed on a same level.

10. The display apparatus of claim 1, wherein
the first pixel circuit comprises:
  a third electrode;
  a first conductive pattern; and
  a third contact hole, and the third electrode is disposed between the first gate electrode and the first electrode, the first conductive pattern is disposed on the first electrode and receives a driving voltage, and the third contact hole connects the third electrode to the first conductive pattern, the second pixel circuit comprises:
  a fourth electrode;
  a second conductive pattern; and
  a fourth contact hole, wherein
the fourth electrode is disposed between the second gate electrode and the second electrode, the second conductive pattern is disposed on the second electrode and receives the driving voltage, and the fourth contact hole connects the fourth electrode to the second conductive pattern, and
a first distance between the third contact hole and the first channel region is less than a second distance between the fourth contact hole and the second channel region.

11. The display apparatus of claim 1, wherein
a peripheral region outside of the display region is included in the substrate, and
the second display region is disposed between the first display region and the peripheral region.

12. A display apparatus comprising:
a substrate comprising a first display region and a second display region of a display region;
a first pixel circuit disposed in the first display region and comprising:
  a first semiconductor layer;
  a first gate electrode; and
  a first electrode, wherein
the first semiconductor layer comprises a first channel region, the first gate electrode overlaps the first channel region in a plan view, and the first electrode overlaps the first gate electrode in the plan view and is connected to the first gate electrode through a first contact hole formed in insulating layers interposed between the first electrode and the first gate electrode;
a first display element disposed on the first display region and electrically connected to the first pixel circuit;
a second pixel circuit disposed in the second display region and comprising:
  a second semiconductor layer;
  a second gate electrode; and
  a second electrode, wherein
the second semiconductor layer comprises a second channel region, the second gate electrode overlaps the second channel region in the plan view, and the second electrode overlaps the second gate electrode in the plan view and is connected to the second gate electrode through a second contact hole formed in the insulating layers interposed between the second electrode and the second gate electrode;
second display elements disposed on the second display region and electrically connected to the second pixel circuit,
wherein the first pixel circuit comprises a first driving transistor configured to output a first driving current to the first display element, and the second pixel circuit comprises a second driving transistor configured to output a second driving current to the second display elements,
wherein a ratio of a first overlapping area of a first overlapping region of the first channel region overlapping the first electrode to a first channel area of the first channel region in the plan view is less than a ratio of a second overlapping area of a second overlapping region of the second channel region overlapping the second electrode to a second channel area of the second channel region in the plan view, and
wherein a magnitude of the first driving current of the first display element that emits light with a first grayscale is less than a magnitude of the second driving current of the second display elements that emit light with the first grayscale.

13. The display apparatus of claim 12, wherein
the second driving current is equally distributed to the second display elements, and a magnitude of a current flowing in each of the second display elements is equal to a magnitude of the first driving current.

14. The display apparatus of claim 12, wherein
an emission area of each of the second display elements is equal to an emission area of the first display element.

15. A display apparatus comprising:
a first pixel circuit comprising:
  a first semiconductor layer;
  a first gate electrode; and
  a first electrode, wherein
the first semiconductor layer comprises a first channel region, the first gate electrode overlaps the first channel region in a plan view, and the first electrode overlaps the first gate electrode in the plan view and is connected to the first gate electrode through a first contact hole formed in insulating layers interposed between the first electrode and the first gate electrode;
a second pixel circuit comprising:
  a second semiconductor layer;
  a second gate electrode; and
  a second electrode, wherein
the second semiconductor layer comprises a second channel region, the second gate electrode overlaps the second channel region in the plan view, and the second electrode overlaps on the second gate electrode in the plan view and is connected to the second gate electrode through a second contact hole formed in the insulating layers interposed between the second electrode and the second gate electrode;
a first display element electrically connected to the first pixel circuit; and
second display elements electrically connected to the second pixel circuit,
wherein a ratio of a first overlapping area of a first overlapping region of the first channel region overlapping the first electrode to a first channel area of the first channel region in the plan view is less than a ratio of a second overlapping area of a second overlapping region of the second channel region overlapping the second electrode to a second channel area of the second channel region in the plan view, wherein
the first pixel circuit further comprises:
  a third electrode;
  a first conductive pattern; and
  a third contact hole, wherein
the third electrode is disposed between the first gate electrode and the first electrode, the first conductive pattern is disposed on the first electrode and receives a driving voltage, and the third contact hole connects the third electrode to the first conductive pattern,
the second pixel circuit further comprises:
  a fourth electrode;
  a second conductive pattern; and
  a fourth contact hole, wherein
the fourth electrode is disposed between the second gate electrode and the second electrode, the second conductive pattern is disposed on the second electrode and receives the driving voltage, and the fourth contact hole connects the fourth electrode to the second conductive pattern, and a first distance between the third contact hole and the first channel region is less than a second distance between the fourth contact hole and the second channel region.

16. The display apparatus of claim 15, wherein the first pixel circuit comprises a first driving transistor having a portion of the first semiconductor layer and the first gate electrode and that outputs a first driving current to the first display element, the second pixel circuit comprises a second driving transistor having a portion of the second semiconductor layer and the second gate electrode and outputs a second driving current to the second display elements, and a number of the second display elements is n, and a magnitude of the second driving current is about n times a magnitude of the first driving current.

17. The display apparatus of claim 15, wherein a ratio of a width of the second channel region to a length of the second channel region is greater than a ratio of a width of the first channel region to a length of the first channel region.

18. The display apparatus of claim 15, wherein an amount of hydrogen included in the second channel region is greater than an amount of hydrogen included in the first channel region.

19. The display apparatus of claim 15, wherein each of the first electrode and the second electrode has a first layer and a second layer, the second layer being disposed on the first layer.

20. The display apparatus of claim 15, wherein the first pixel circuit comprises:

a third semiconductor layer; and a first connection electrode, the third semiconductor layer comprising an oxide semiconductor material, and the first connection electrode electrically connecting the first electrode to the third semiconductor layer, and the second pixel circuit comprises a fourth semiconductor layer and a second connection electrode, the fourth semiconductor layer comprising an oxide semiconductor material, and the second connection electrode electrically connecting the second electrode and the fourth semiconductor layer to each other.

* * * * *